United States Patent [19]

Ragard et al.

[11] 3,727,284

[45] Apr. 17, 1973

[54] APPARATUS FOR SELECTING AND INSERTING DUAL IN-LINE COMPONENTS

[75] Inventors: Phillip A. Ragard; Albert W. Zemek; Weibley J. Dean; Robert H. Holmes, all of Binghamton, N.Y.

[73] Assignee: Universal Instruments Corporation, Binghamton, N.Y.

[22] Filed: Nov. 3, 1971

[21] Appl. No.: 195,268

[52] U.S. Cl. ....................29/203 B

[51] Int. Cl. ....................H05k 13/04

[58] Field of Search....................29/203 B, 203 R, 29/203 D, 208 D, 203 DT

[56] References Cited

UNITED STATES PATENTS

| | | | |
|---|---|---|---|
| 2,814,802 | 12/1957 | Maximoff | 29/203 B |
| 3,670,385 | 6/1972 | Cropp | 29/203 B |

*Primary Examiner*—Thomas H. Eager
*Attorney*—Fidelman, Wolffe, Leitner & Hiney

[57] ABSTRACT

An apparatus for individually selecting a number of dual in-line components and sequentially inserting them into a printed circuit board. The apparatus has a basic mode of operation comprising a group of feed magazines that are adapted to feed a single shuttle block which takes the components by a predetermined sequence and carries them to a transfer mechanism which bends the leads on either side of the component outwardly, transfers the prepared component to an insertion mechanism which forces the component downwardly while simultaneously biasing, but not bending, the leads inwardly. Another portion of the insertion mechanism forces the component with its biased leads into the printed circuit board. The printed circuit board is mounted on a pantograph mechanism whose position is controlled by either a tape reader or a computer which also determines the automatic sequencing of the shuttle block.

27 Claims, 33 Drawing Figures

INVENTORS
PHILLIP A. RAGARD
ALBERT W. ZEMEK
WEIBLEY J. DEAN
ROBERT H. HOLMES

BY Fidelman, Wolffe & Leitner
ATTORNEYS

APPARATUS FOR SELECTING AND INSERTING DUAL IN-LINE COMPONENTS

This invention relates to an apparatus for selecting and inserting dual in-line components. Such components have a generally rectangular body and have a series of leads extending from either side of the body and bent at right angles to extend generally in the same direction. Most of these components have either 14 or 16 leads but they can have more or less.

Prior methods of handling such components has resulted in subjecting the components to the possibility of damage to the body and leads or misalignment of leads. A solution to this has been the use of dual in-line carriers in which the components are inserted and then when the compoenents are ready to be inserted into a printed circuit board, the insertion mechanism punches the component out of the carrier and into the circuit board. One of the problems, however, with such a solution has been the added problems of inserting the component into the carrier and handling the carriers and the expense of the carriers themselves. Even with automatic machines, problems resulted due to the fine tolerances and accuracy needed in such work. There has been a need for a machine to take the components from a tube, in which they are generally loaded, and insert them directly into a printed circuit board without the necessity of using the intermediate carriers to insure against damage to the components.

Further, there has been a need for a machine which will not only insert the components directly from the magazine tubes, but also provide some versatility in the manner in which the components are inserted. In other words, there has been a need for a machine which can select components from individual magazine tubes in a predetermined sequence and transfer them to an insertion mechanism and also provide a machine which can select a group of components which are loaded in a predetermined manner in the magazine tubes and then to step or sequence the components into the insertion mechanism in the order selected.

Another problem in the past has been that when the leads are bent and then straightened in an insertion position some of the leads may be slightly off or bent inwardly too much, thereby resulting in damage to the lead as the insertion mechanism attempts to insert the lead into a circuit board The instant apparatus provides solutions to the above described problems. The apparatus of the present invention can accept tubes of loaded components placed in a predetermined manner and selected from said loaded tubes, bias the leads outwardly beyond the insertion position, and then at insertion, push against the leads sufficiently to align them with the pre-drilled or pre-cut holes in the circuit board. Such a procedure eliminates the possibility of any of the leads being bent inwardly too much, thereby causing misalignment and damage to the component and possibly the machine.

In the random access mode, usually about 24 stick carriers or tubes are placed on the machine, a signal is given and individual gates are activated to allow the parts to fall down into an escapement area. A moving pocket or shuttle, upon command from a tape reader computer, then goes to the predetermined position, asks for a part, whereby a finger is activated similar to a coin changer, and one part is allowed to fall out into the shuttle area. The shuttle then moves to the transfer mechanism where another signal allows the part to fall out of the shuttle and when this operation is completed, the shuttle goes back and selects another components. The transfer mechanism, through the use of fingers and rollers, biases the leads of the component outwardly as it rotates approximately 45° with the finger retaining the component. During the first 20° of rotation, the leads are spread outwardly and, as the rotation continues, a pressure section pushes on the last two leads and transfers the component out over a vacuum pocket. The component is always positioned in the same place relative to the vacuum block whether the component has 14 or 16 leads.

The insertion mechanism has two basic mechanisms, the first being a picker section which upon command swings over at 45° over the top component, drops onto the component, picks it up, and swings back until it is in line with the insertion head. The second portion comprises a part within the insertion head which upon command slides down along with the picker and a first set of insert combs therewithin, goes down with the component to the top of the circuit board and stops and a second set of pickup combs takes the component, which is not all the way down to the circuit board, pushes it down through the insert combs and into the circuit board. A conventional type of clinching mechanism is provided underneath the board and, upon command, clinches the leads against the board.

This process is repeated until all of the components have been inserted into the circuit board whereupon another board is placed on the pantograph and the stick carriers are reloaded with the appropriate components.

Accordingly, it is an object of this invention to provide an automatic apparatus for selecting and inserting dual in-line components into circuit boards.

It is a further object of this invention to provide a novel transfer apparatus which biases leads on dual in-line components in a component insertion mechanism.

It is a further object of this invention to provide a component insertion mechanism having a random access mode.

It is a further object of this invention to provide a novel lead biasing mechanism within a dual in-line component insertion apparatus.

It is a further object of this invention to provide a novel pickup and insertion mechanism within a dual in-line component insertion apparatus.

It is a further object of this invention to provide a novel shuttle assembly for a random access selection of components in a dual in-line component insertion apparatus.

It is a further object of this invention to provide a novel component transfer mechanism which, while rotating 45°, biases the leads outwardly on a dual in-line component to prepare the component for insertion into a circuit board thereby eliminating any problems caused by leads bent inwardly.

A further object of this invention is to provide two sets of novel lead combs in an insertion apparatus designed to insert dual in-line components into circuit boards.

It is still another object of this invention to provide a novel magazine and ready pack assembly for random selection of components in a dual in-line component insertion apparatus.

It is a further object of this invention to provide an automatic dual in-line component insertion apparatus controlled by a computer.

These and other objects of the invention will become readily apparent when reference is taken to the following specification and accompanying drawings in which.

Figure 1:
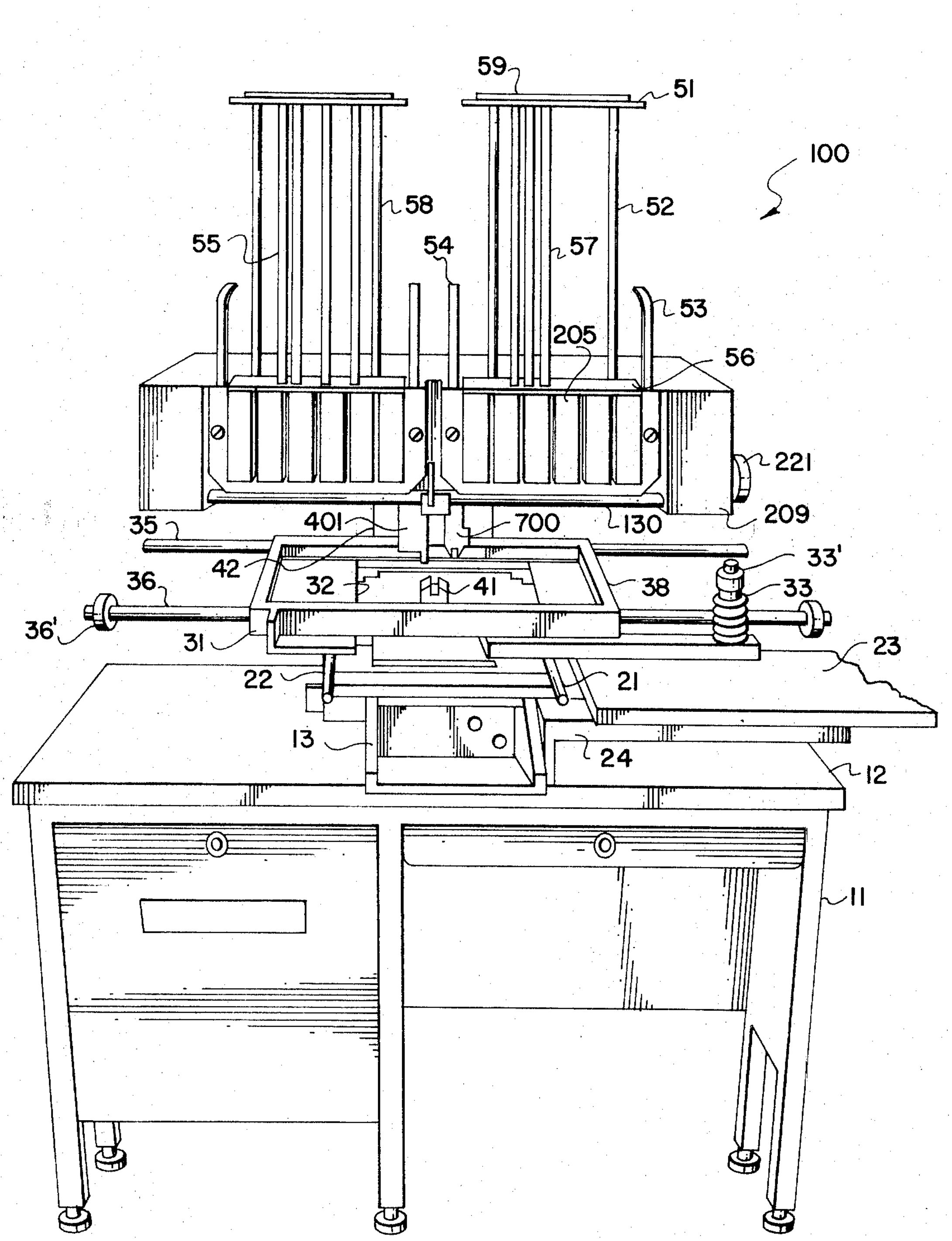
FIG. 1 is an overall perspective view of the apparatus comprising this invention.

Referring now to FIG. 1, there is shown the general arrangement of the apparatus. The machine is designated generally as 100 and rests on table support 11 having table top 12. The supporting structure 13 provides a base for pantograph mechanism 31. Pantograph 31 is a conventional X-Y axes powered support having frame 38, X axis shafts 35 and 36 and Y axis shafts 21 and 22. Attached to frame 38 is a handle 33 by which an operator may shift the table to the correct position, or, in the preferred embodiment, where either a tape reader or computer directs the pantograph to the proper position, it provides a grip by which the operator can depress button 33' to operate the insert mechanism.

Stops such as 36' are provided on the axis rods. A secondary table 23 is provided and supported by frame 24. Positioned in an opening 32 in frame 38 is a clinching mechanism 41 which clinches the heads of components inserted on a printed circuit board adapted to be supported by frame 38.

A magazine and shuttle assembly 200 is provided on top of a vertical support 42. It consists of a main plate support 209, a guide bar 130 for the shuttle assembly and other components such as retaining plate 205. The top of member 209 has a member 56 having guide members 53, 54 which provide support for magazine tubes or carrier sticks such as 55 and 57, which contain a predetermined number of components. A support frame 51,59 and vertical posts 52 and 58 aid in maintaining the tubes upright. A pulley 221 and belt transfer rotary power to a screw shaft for moving the shuttle assembly.

Figure 2:
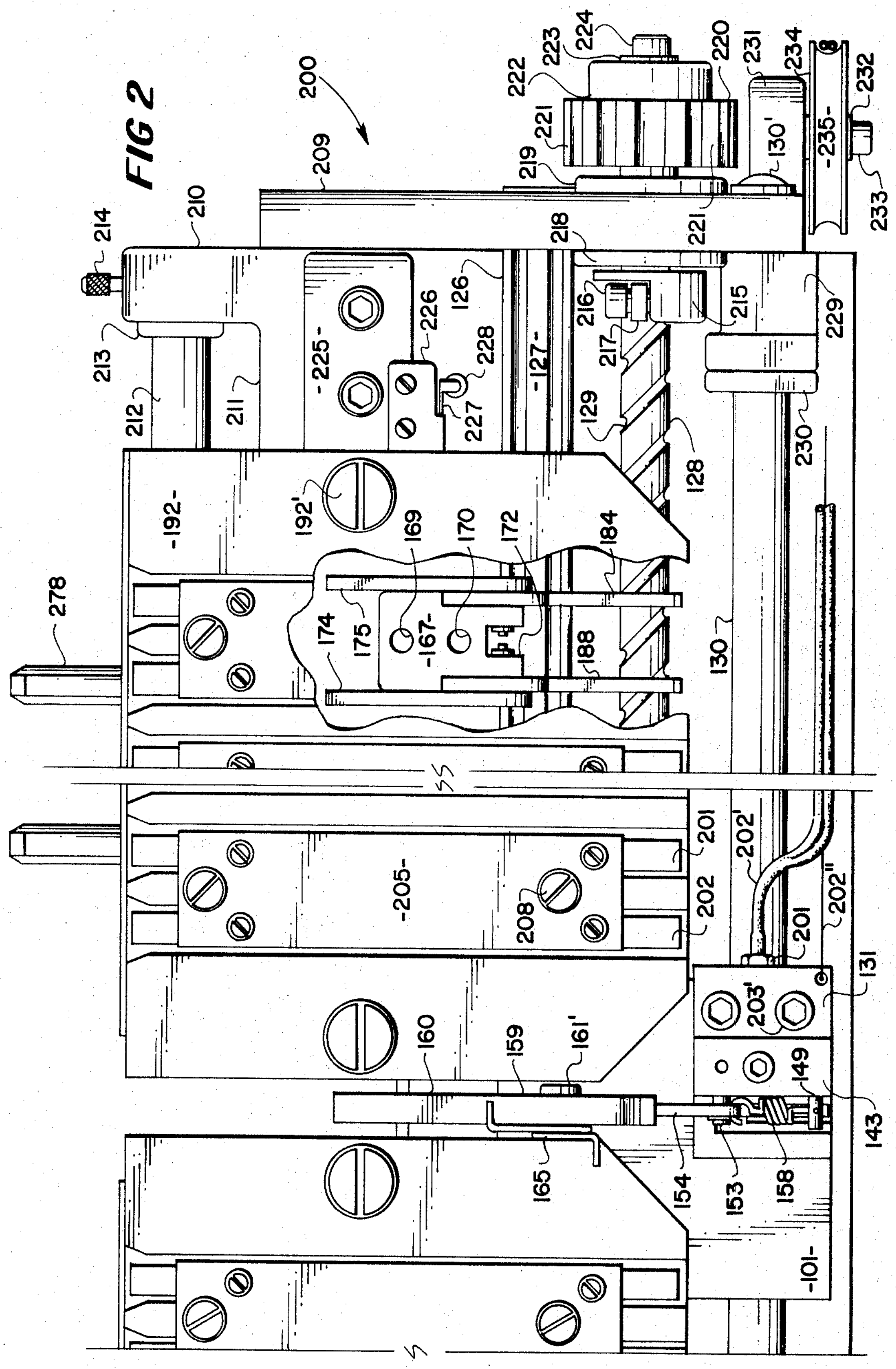
FIG. 2 is a front partial sectional view of the random selection magazine and shuttle assembly.

Referring now to FIGS. 2–9 there is shown the magazine and shuttle assembly. The assembly is designated generally as 200. In FIG. 2 a front view showing a portion of the assembly is illustrated.

Figure 7:
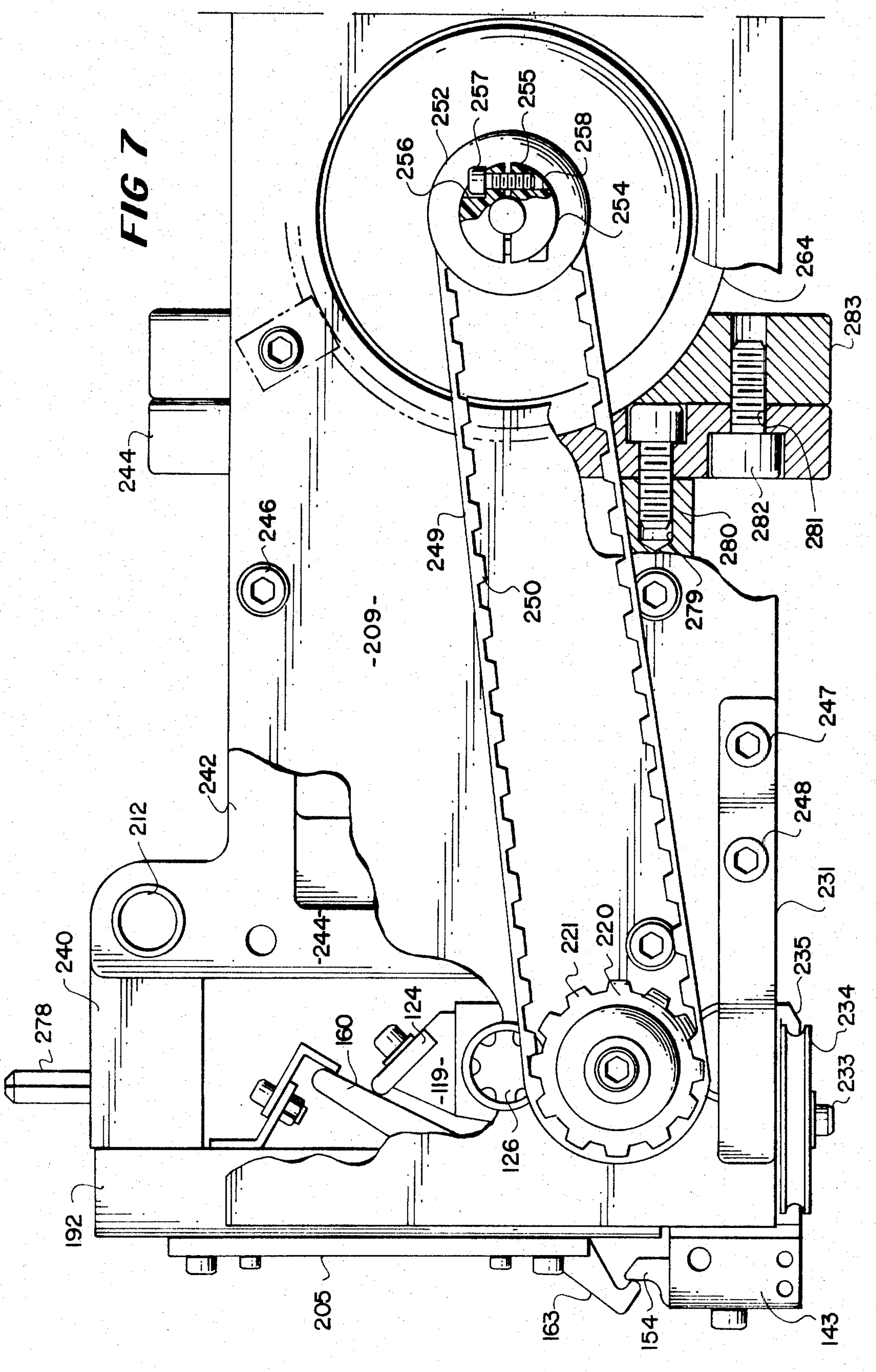
FIG. 7 is a side view similar to FIG. 4 showing the main drive assembly.
Figures 29, 30:
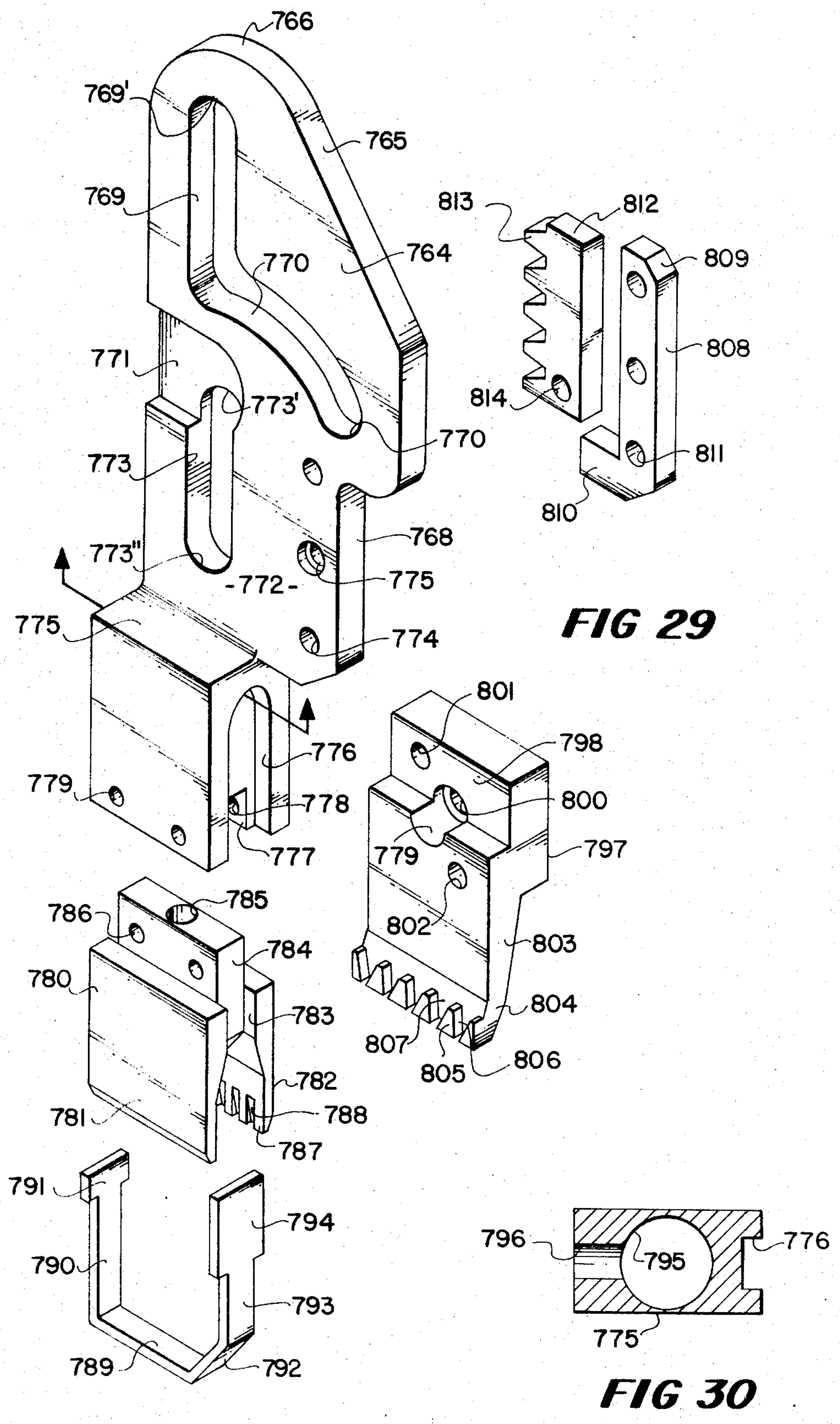
FIG. 29 is an exploded view of the insertion mechanism components showing the swing arm, the insert jaws, the finger pickup and the pusher.
FIG. 30 is a sectional view taken along lines 30—30 of FIG. 29.

The assembly consists of a general supporting frame member 244 as shown in FIG. 7. Frame 244 is a rearwardly projecting portion 242 and a pair of upstanding rear portions such as 210 shown in FIG. 2. A shaft 212 is mounted in the air portions and secured therein by locking washes such as 213. A locking member may be provided such as neural locking screw 214. Shaft 212, as shown in FIG. 30, transverses the assembly and has a main magazine member 239 mounted thereon. Member 239 has a pair of ears such as 240, shown in FIG. 3 projecting rearwardly having apertures through which shaft 212 projects. Member 239 is adapted to be tilted in a clockwise direction up and above member 244.

Secured to member 239 by machine screws such as 192' is a mounting bracket 192. Mounting bracket 192 is shown in detail in exploded view in FIG. 5 and has a plurality of mounting apertures such as 194 and 192' and tapered portions such as 193. Mounting plate 192 is slotted to provide a plurality of slots such as 196 and 195. The slots are counterrelieved to form corresponding and parallel slots such as 197. The upper portions of slots 195 and 197 are tapered as at 198 and 199 respectively. Thus it is seen between the overlying slots there are a plurality of ridges formed having holes threaded such as 200 adapted to receive screws such as 209. Adapted to be mounted on the face of the mounting bracket overlying two pairs of slots is a retainer plate 205. Plate 205 has a pair of central bores such as 206 and a plurality of mean screw bores 207. The retaining plates are secured to a pair of guide members such as 202 and 201. These guide members are tapered at their upper edge extremity as at 204 to correspond to the tapering in the slots 197 and 195. Each guide has mounting holes such as 203 to a line with holes such as 207 and retaining plate 205. The assembled combination of the guides and retaining plates have been mounted to the mounting plate by screws such as 208 to provide, in conjunction with slots 195 and 197 an escapement slot corresponding to the general configuration of the DIP modules or components.

In FIG. 2 the mounting plate 192 is shown in position on support member 239. To insure against lateral movement of member 239 and mounting plate 192 a positioning block such as 225 as shown in FIG. 2 is bolted by machine screws or the like into main frame member 244. In other words, mounting plate 192 takes a further extension portion 241 secured thereto by machine screw 192'. Portion 241 at the right against member 225 has the mounting plate to the remaining assembly swung counter-clockwise upwardly.

Figure 8:
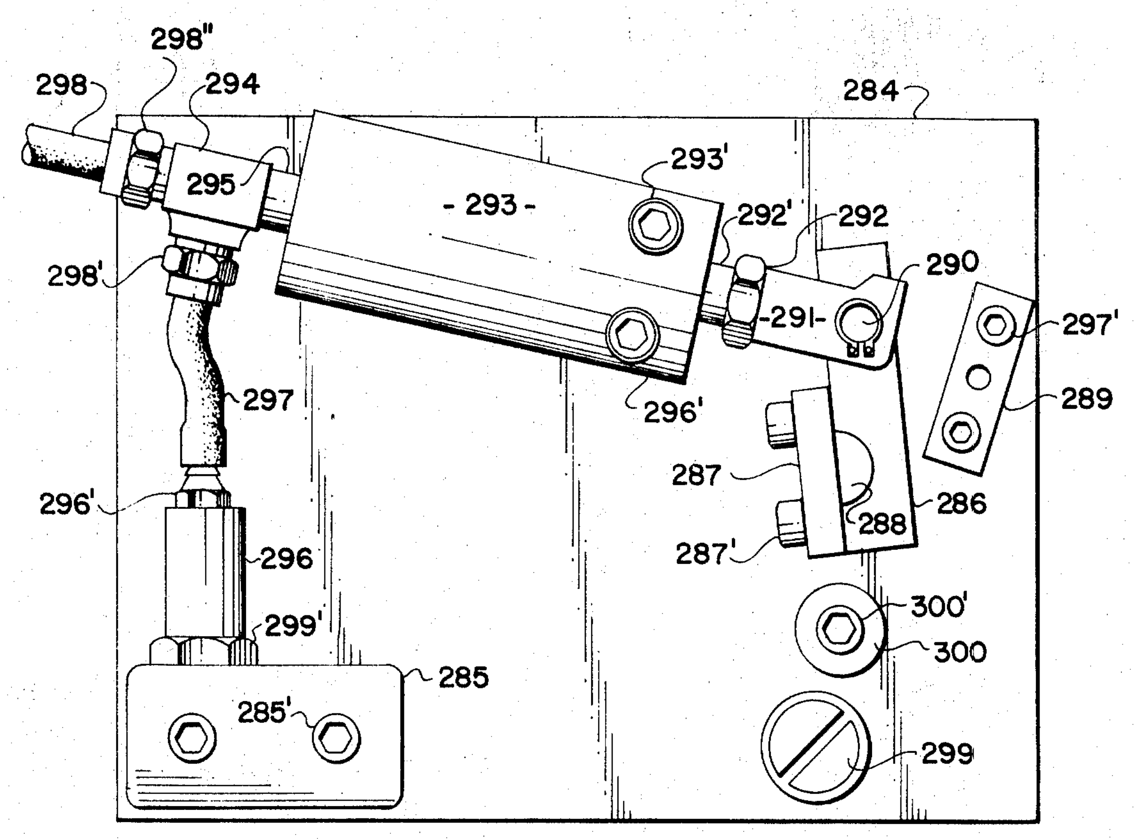
FIG. 8 is a rear view of the assembly showing the pneumatic mechanism for holding the spline shaft.

Member 244 is a pair of side plates such as 209 mounted thereto by a machine screw such as 246 shown in FIG. 7. Journaled within the side plates are three shafts as shown in exploded view in FIG. 6. The top shaft is a spline shaft 126 having splines such as 127 thereon and is situate at its ends in the side plate such as 209. The other end of shaft 126 is cut away to form a semi cyclic extension such as 288 as shown in FIG. 8. The shaft 126 is mounted for rotary reciprocal motion to the action of a piston 293 as shown in FIG. 8. Piston 293 is connected via coupling numbers 294 and 295 and threaded member 298' to air hose 298. Member bolt 298' connects member 294 with hose 297 which in turn is fitted onto member 296' and fixture 296. Fixture 296 is secured to valving assembly 285 by threaded member 299'. Member 285 is secured to side plate 284 by machine screws such as 285'. Piston member 298 is a piston rod 292 which is secured through a coupling 291 by adjustment nut 292. The end of shaft 126, in other words, portion 288 has a rocker arm 286 attached thereto which has a stud 290 adapted to project through a bore member 291 and be fastened thereto by a locking ring. To maintain rocker arm 286 on shaft extension 288 a retaining member 287 is provided and screwed into member 286 by machine screws such as 287'. Thus as is seen, when the piston 293 is activated the piston rod through member 291 causes rocker arm 286 to rotate in a clockwise action thereby also rotating shaft 126 a predetermined amount. The predetermined amount is directly proporational to the piston stroke of 293. A stop member 289 is positioned on side plate 284 by machines screw 297' and stop plate 289 functions to limit the amount of arcuate rotation of the spline shaft 126.

Mounted beneath spline shaft 126 is critical drive shaft 128 hitting vehicle groove 129 therein. One end of shaft 128 projects through side plate 284 and is adapted to rotate therein. Bearing member 300 as seen in FIG. 8 is secured into sahft 128 by machine screw 129. The third shaft is a guide shaft 130 which is secured inside plate 284 by screw member 99. Shaft 130 remains in place and does not rotate.

The other end of shaft 128 is secured inside plate 209 through a coupling member 215. Coupling member 215 has a plate 217 secured to the main body thereof by machine screws 216. A shaft 224 projects from member 215 and is journaled to inside plate 209 by journals such as 237 which are with 236 and within the side plate 209.

Sprocket 200 has a flange member 222 extending therefrom and is held on shaft 224 by locking washer 223 as shown in FIG. 2.

Projecting upwardly from member 239 are a plurality of studs such as 278 held in place by press fit members 227. These members are shown in FIGS. 2 and 3 and FIG. 7 and are used to receive the ends of plastic magazines which fit down into a ready pack assembly [not shown] to feed components down into slots such as 195.

Figure 3:
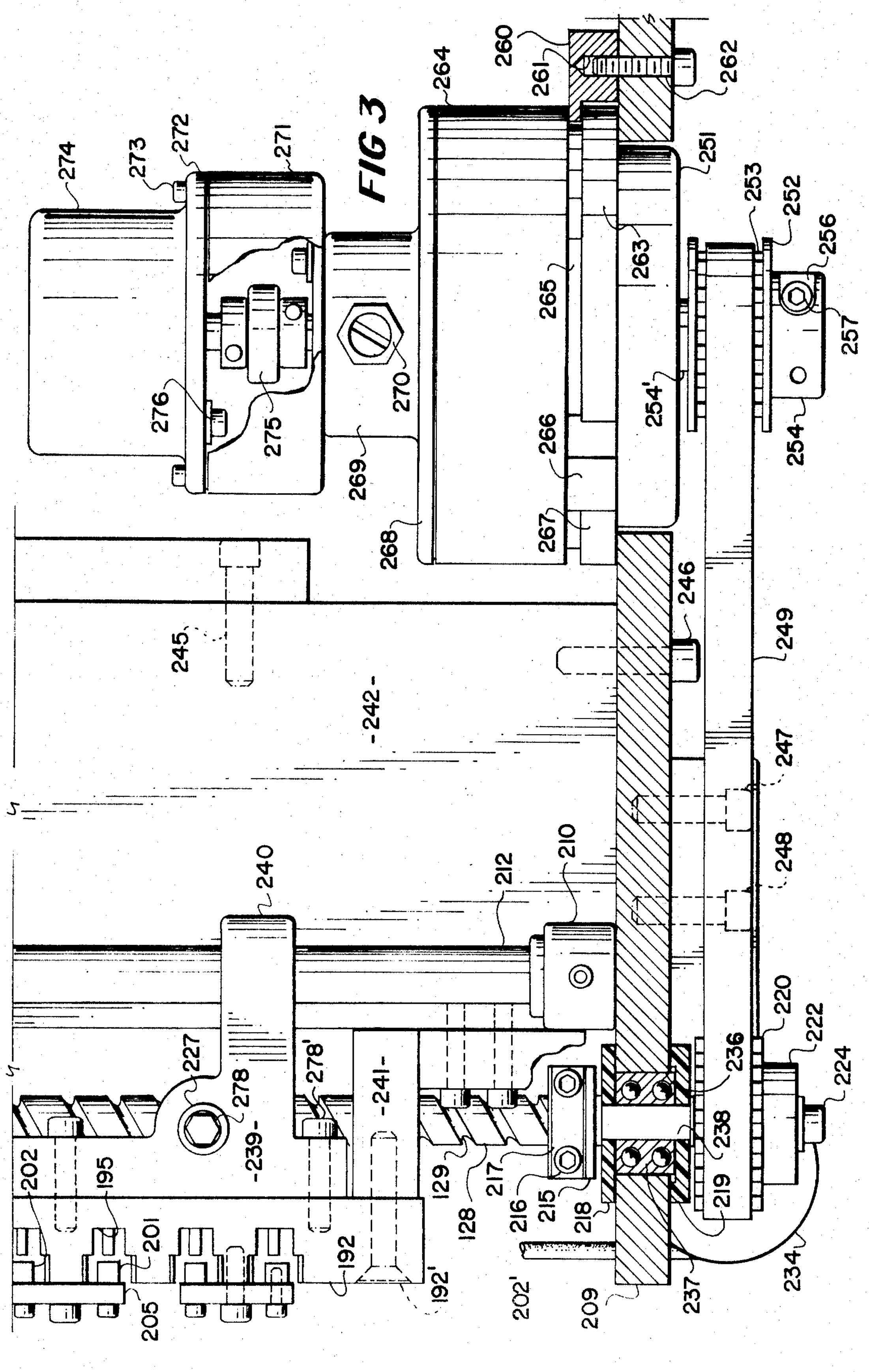
FIG. 3 is a top view of the assembly shown in FIG. 2.
Figure 4:
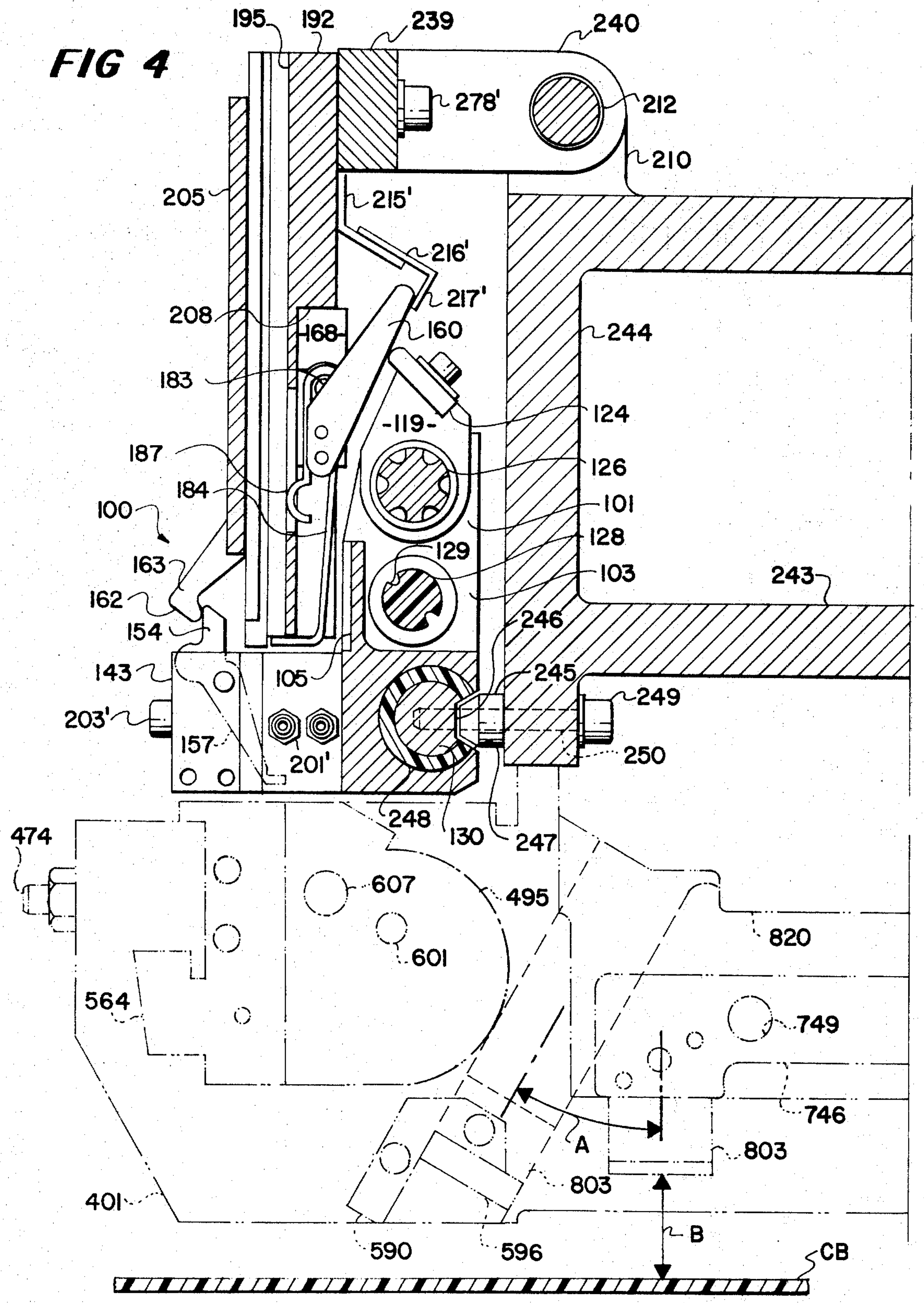
FIG. 4 is a side sectional view of the assembly shown in FIGS. 2 and 3 and showing the transfer mechanism in phantom.

As shown in FIGS. 3, 4 and 7 main frame member 244 has a pier of rearwardly projecting portions 242 and 243. As seen in FIG. 4, member 244 projects down beyond portion 243 and is bored to receive a shaft 250 having a head 249 which in turn secures a guide member 245 at the lower portion of frame member 244. Mounted to the rear of portion 242 and 243 is a main frame vertical member 244 held in place by machine screw 280 which is threaded into a passage 279 in portion 243. Member 244 is in turn connected to vertical member 283 by machine screw 282 readily engaging passage 281 in member 283. Plate 209 is a large bore which receives facing portion 251 of a clutch assembly 264. Clutch assembly 264 is seen in FIG. 3 and contains portions 265–267 and a projecting portion 263. Portion 265 is adapted to receive the end of a projectionally locking member 260 which is held in place in side plate 209 by machine screw 262 totally engaging threaded passage 261 in member 260. A shaft 254' projects from portion 251 and has a sprocket 252 thereon having grooves such as 253 to engage a drive belt 249 having corresponding projections in grooves such as 250 as seen in FIG. 7. A locking collet 254 secures sprocket 252 in place and has a leave sect area 256 in a threaded bore 258. A machine screw 257 locks member 254 in place on shaft 254' to insure against accidental displacement of sprocket 252.

Portion 266 has a projecting portion 267 which acts as a stop member against the inside portion of side plate 209 to prevent the clutch assembly from projecting outwardly. Clutch assembly 264 has a portion 268 merging into a flange portion 269 having an adjustment screw 270 thereon. The shaft from clutch assembly 264 terminates in a flexible covering 275 which in turn connects it to the drive shaft of the motor 274. Motor 274 is bolted by screws such as 273 and 276 passing through its flange 272 to a housing 271 which in turn is connected to flange 269 by internal machine screws or the like.

Drive belt 249 engages the sprockets such as 221 in sprocket wheel 223.

As shown in FIG. 2, a side member 231 is secured to side plate 209 by a machine screw such as 248 and 247 as shown in FIG. 3. A shaft 233 projects downwardly from member 231 and supports a pulley 235 held in place by lock washer 232. The purpose of pulley 235 is to provide a smooth feed mechanism for air hoses such as 202′ going through the shuttle member itself.

Figure 5:
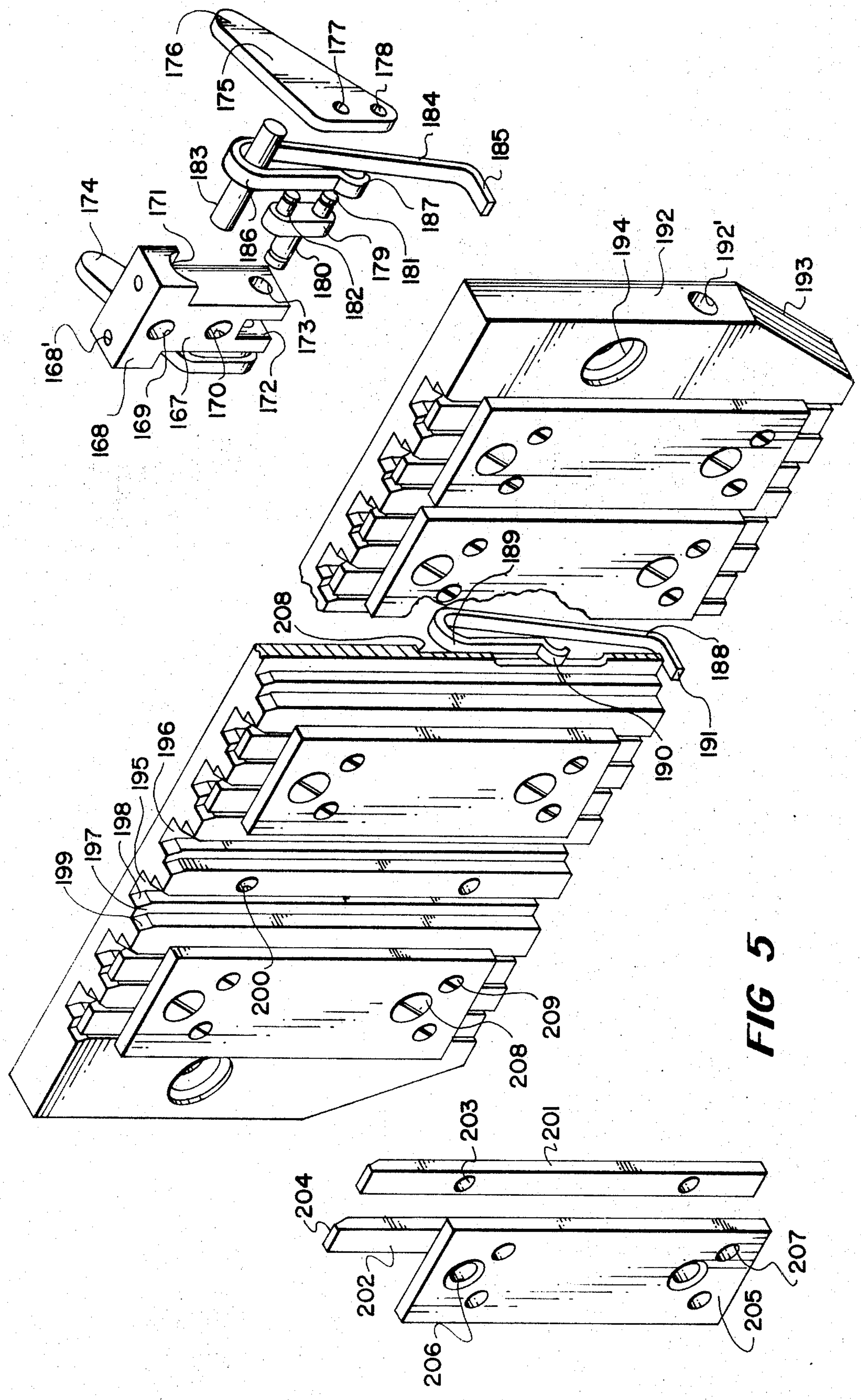
FIG. 5 is a perspective view of the retainer used in the random access shuttle assembly with portions in exploded view.

Referring to FIGS. 4 and 5 it is seen that the rear of mounting plate 192 is cut away as at 208 to provide internal shelter and further contains cut-out slots within each one of the slots such as 195. Projecting through these cut-out slots is a arcuate portion 187 of a retaining spring 188. Spring 188 is bent back on itself and terminates its lower extremity in outwardly projecting portion 191. There is one of these springs located behind the mounting plate 192 at each slot location. Referring now to FIG. 5, a spring 184 similar to spring 188 is shown together with a mechanism graduating it. A T-shaped release lock 167 is at upper T-section 168 and contains ports 169 and 170. It has a slot at its lower extremity at 172 and has a transverse bore 173 projecting through the slotted portion. Key portion 168 has a bore passing therethrough and is relieved in its T-arms as at 171. A pair of attachment holes are provided as at 168 on top of the T-section. An actuating bar 179 has a shaft 180 adapted to pass through bore 173 and terminate within the slot 179 and to be secured thereto by a washer. Member 179 also has two actuating extensions 182 and 181 which are adapted to reside within the curved portion 186 of spring 184. The rocker shaft 183 passes through the bore in the T-section 168 and resides, as shown in FIG. 4, within the reverse bend of spring 184. Portions 181 and 182 are adapted to engage within holes 177 and 178 of the flipper 175. Flipper 175 is an actuating portion 176 which tapers away from the area of holes 177 and 178. A similar flipper bar in 174 is mounted on the other side of T-member 167.

The T-shaped member 167 with flipper bars 174 and 175 is shown in position in FIG. 2. The T-shaped member is held in place by screws passing through holes 169 and 170. Also shown in FIG. 2 is the lower portions of springs 188 and 184. A stop plate 217′ having angle portion 216, as shown in FIG. 4, prevents the flipper bar from moving in a clockwise direction any further than where it engages 217′. Angle portion 216′ is connected adjustably to another bracket member 213′.

As shown in FIG. 4 the components are adapted to ride down slot 195 until they engage the lower projection portion 185 of the spring 184. Rotation of the flipper bar 175 or 160 in a counter-clockwise direction will move portion 185 away from the bottom of slot 195 and allow a component resting thereon to drop down into the shuttle mechanism. Simultaneously portion 187 will be forced outwardly against the next highest component within slot 195 thereby maintaining it in position while the lowermost component drops out. When flipper bar 160 is released, portion 185 again blocks the bottom of the escapement slot 195 and the pressure of portion 187 of spring 184 is released on the next highest component thereby allowing it to drop down until it abutts portion 185.

Figure 6:
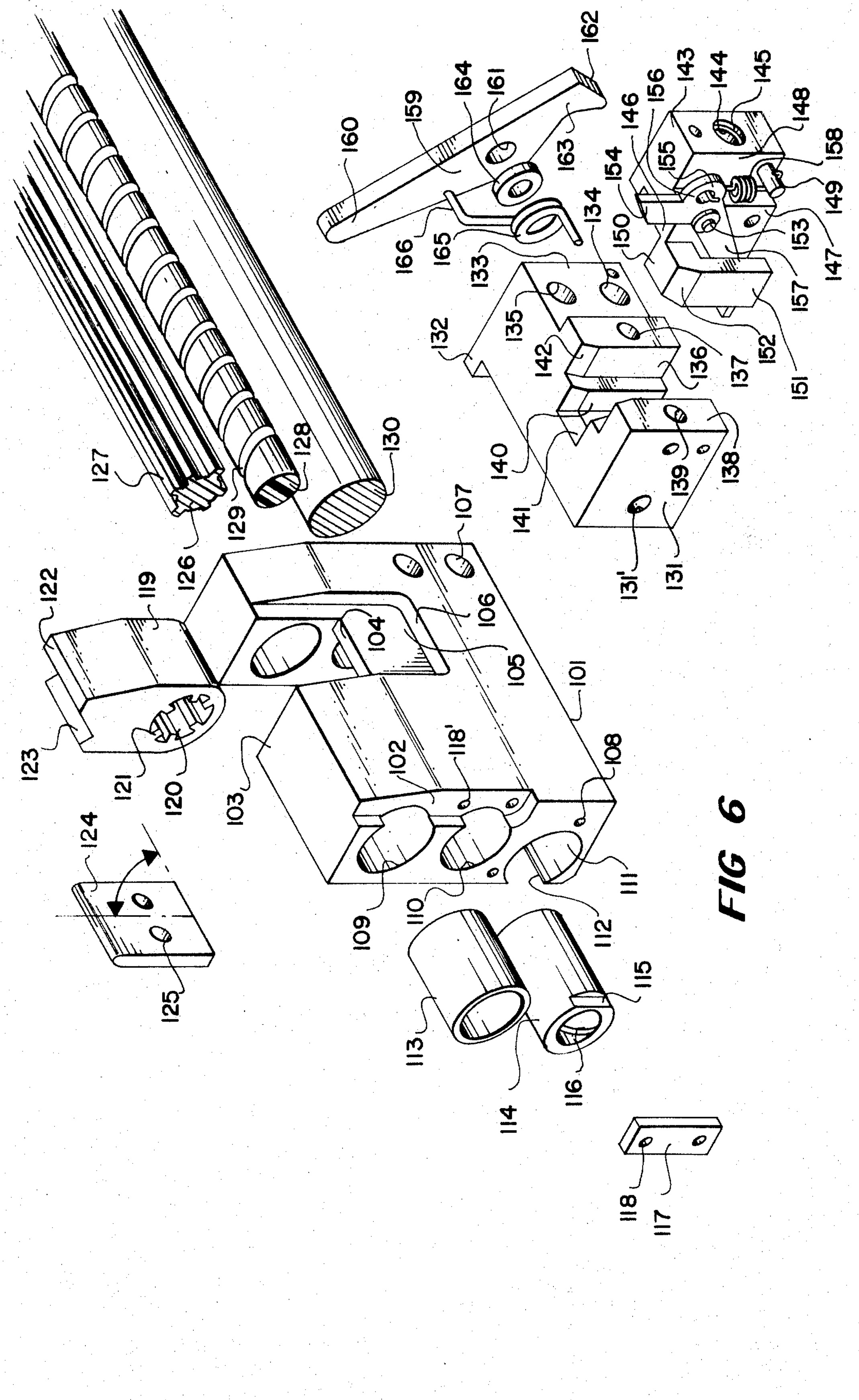
FIG. 6 is an exploded view of the shuttle carriage showing the three shafts on which it rides.

Referring now to FIG. 6, there is shown the shuttle assembly in exploded view and its relationship to the three shafts, 126, 128 and 130. The assembly consists of a main shuttle carriage 101 which has upper portion 103 cut away as at 106 to provide the vertical portion 105 which is further cut down as at 104. The edge of the carriage is relieved as at 102 and provided with casting passages such as 118′. Through-bores such as 109, 110, and 111 are provided within the carriage 101. Bore 111 is of such a size as to provide an opening 112 in the rear of the carriage. A bushing or sleeve 113 is adapted to be positioned within bore 109 on both sides of cut away portion 106. A locking sleeve 114 is adapted to be positioned within bore 110 and provided with internal, heatable ridges such as 116 and a cut away portion 115. Cut away portion 115 meets with cut away portion 102 when the locking sleeve 114 is in positioning bore 110. The sleeve 114 is held in position by a retaining plate 117 having holes 118 therein which acts against the cut away portion 115 to prevent rotation of the locking sleeve 114. The helical shaft 128 is threaded through sleeve 114 so that rotation of shaft 128 will cause movement of the carriage along the various shafts. Sleeve 113 allows shaft 126 to move through the action piston 293 within the sleeve without effecting the position of movement of the carriage. A cam member 119 is adapted to be positioned within the cut away portion 106 and contains a bore 120 having internally directed splines 121. The splines 121 are adapted to meet within the grooves provided between splines 127, thereby rigidly locking cam 119 on shaft 126 for rotative movement although allowing it to slide along shaft 126. The upper portion of cam 119 is relieved as at 122 and 123 to provide a mounting portion for a cam plate 124. Cam plate 124 has a series of holes such as 125 therein which allow it to be fastened, such as by machine screw or the like onto cam 119 as shown in FIG. 4. The upper portion of cam plate 124 is adapted to engage the lower edge of flipper bar 160 [see FIG. 4] and when the rocker shaft is rotated counter-clockwise, as seen in FIG. 4, the flipper bar accordingly moves counter-clockwise in an arcuate direction thereby releasing a component.

A shuttle block 131 is adapted to be mounted on the face of carriage 101 by machine screws or the like passing through holes 135 and 134 in block 131 and holes 107 in carriage 101. Shuttle block 131 contains a slot 140 and a larger slot 136. These slots are respectively bevelled at their upper edges as at 141 and 142. Slots 14 and 136 correspond to the slots forming the escapement passage 195. Another member 143 is adapted to be mounted to the face of shuttle block 131. It contains a projection 150 which acts like one of the guide members to form the internal portion of the escapement passage. Portion 150 is bevelled as at 152 terminating and depending on 151. The member is further relieved as at 148 which has extending therefrom an anchoring stud 149. A stud 153 secures a trip arm 155 to member 143. Trip arm 155 has a bore 156 therein through which one end of a tension spring 158 is secured. The action of spring 158 tends to rotate trip arm 155 in a clockwise direction. Trip arm 155 has a projecting portion 157 which projects down between depending portion 151 and the main body of member 143. A second projection 154 projects upwardly from trip arm 155 and is adapted to engage by a flipper 159. Flipper 159, as shown in FIG. 6, has an upper actuating portion 160 and a lower actuating portion 163 having a bevelled face 162 thereon. A passage 161 through flipper 159 is adapted to receive the machines screws such as 161', as shown in FIG. 2, which secures the flipper to a mounting plate such as 192. A washer 164 acts in conjunction with a spring 165 having actuating portion 166 to maintain the flipper 159 in a position as shown in FIG. 4 of the drawings. Flipper 159 acts in a similar fashion to flippers 174 and 175 inasmuch as they are actuated by cam plate 124 of the carriage 101 when helical shaft 126 is reciprocated or rotated by piston 293. When this occurs actuating portion 163 engages portion 154 of trip arm 155 thereby rotating it in a clockwise direction as shown in FIG. 4 which acts against the tension of spring 158 to withdraw portion 157 from the escapement portion formed by slots 140 and 136. When this occurs a component held within the shuttle mechanism can drop down into the transfer mechanism to be described.

Member 143 is mounted on shuttle 131 by a screw such as 203' as shown in FIG. 4 passing through counter bores 144, 145 and into threaded passage 137 and carriage block 131.

Figure 9:
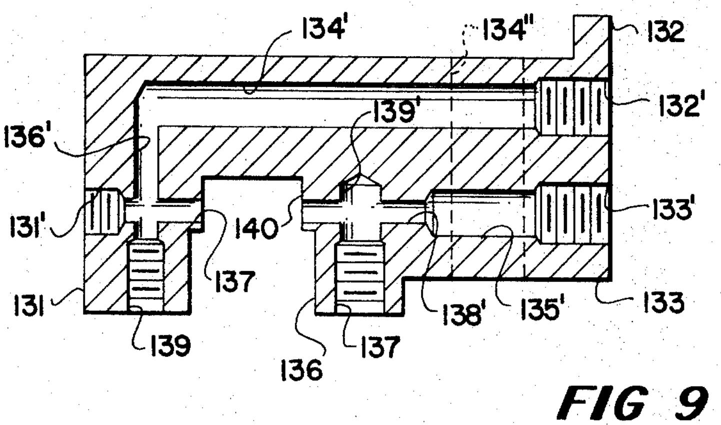
FIG. 9 is a sectional view of a portion of the shuttle block.

Carriage block is shown in cross-section in FIG. 9 and as seen contains the projection 132 and capped passages 132' and 133'. These passages are in communication with bores 136', 135' and 138'. The front of carriage block 131 is bored as at 139 and 137 which receive machine screws holding member 143 in place. A plug bracket [not shown] is entered into threaded passage 131' and triple fastenings such as 201' as shown in FIGS. 2 and 4 are threaded into portions 132' and 133'. The passages thus provide an open pneumatic communication with slot 140 as at 137. Air hoses such as 202' as shown in FIG. 2 connect with fastenings 201 and are trained around employee 235 as shown in FIG. 2. The purpose of the open passages are to provide a signal, a pneumatic signal, to a pneumatic valve to actuate the portions of the transfer mechanism or other components of the device. When a component is in place within carriage shuttle block 131, and held in place by portion 157 of tripon 155 it is sensed by the pressure differential in front of the bore, such as at 137. This signals a valve to operate thereby commanding the apparatus to move onto the next step since a component is in place.

Flipper 160, as shown in FIG. 2, is located central of the mechanism and is used to actuate the shuttle mechanism to drop a component into the transfer mechanism. The device is adapted to be operated pneumatically with signals being given to piston 293 to initially drop a pre-selected component from one of the escapement slots such as 195 into the shuttle block and, when the shuttle block moves over to its central unloading position, actuate flipper 150 to drop the component down into the transfer mechanism. Motion to the shuttle carriage and block is provided through rotation of helical drive shaft 128 which is driven by belt 249 connecting it with motor 274. To load the various escapement slots such as 195 with the components the portion 239 is swung upwardly in a ready pack assembly [not shown] and is slipped onto studs such as 278 to lock it into place.

Figure 10:
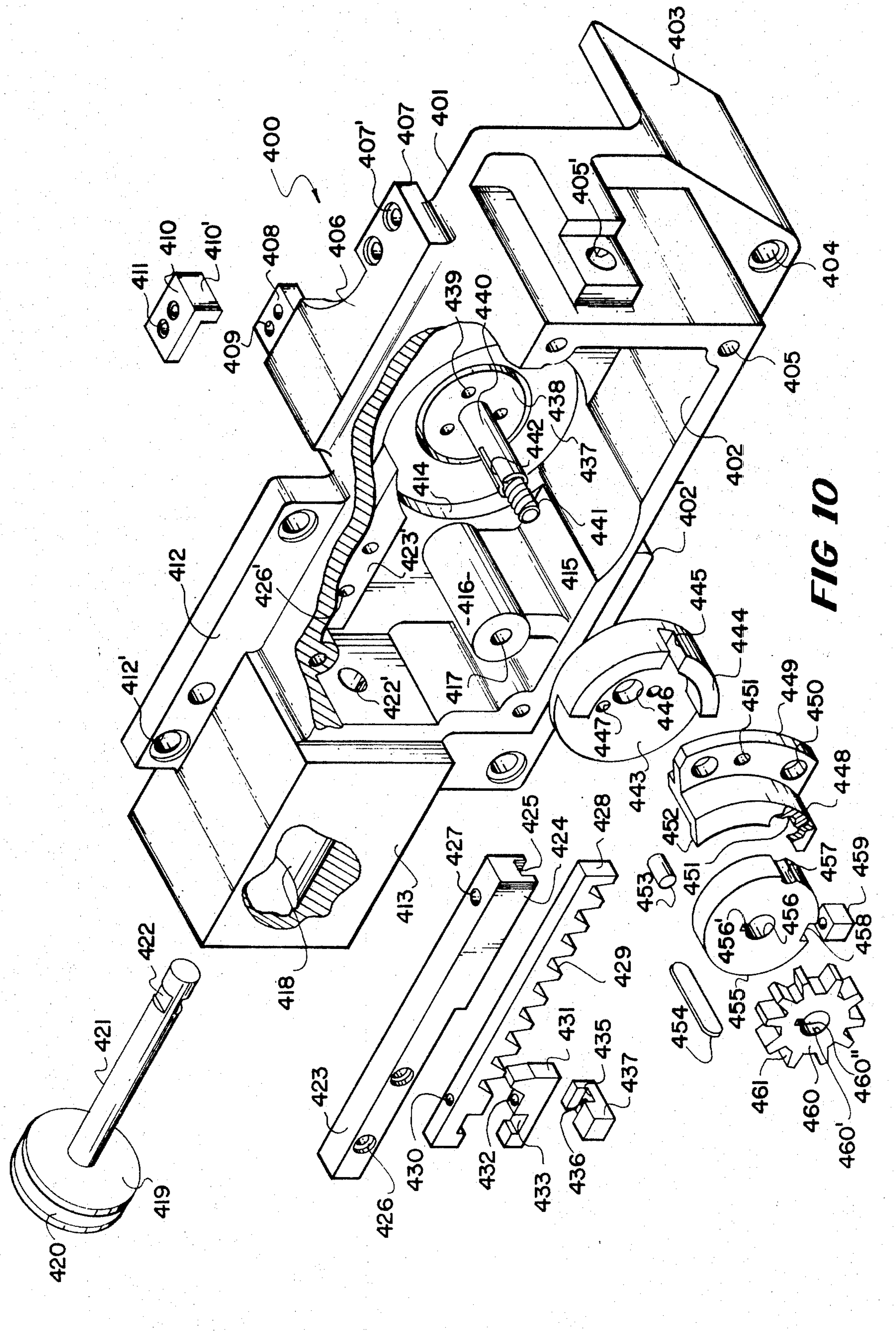
FIG. 10 is an exploded view of the rear drive section of the transfer mechanism.

Referring now to FIGS. 10, 11, 12, 13, 14, 15, 16, 17, 18, 19, 20, 21, and 22 there is shown the component lead biasing and transfer mechanism generally designated as 400. The assembly is housed in a main body 401, as shown in FIG. 10, which serves as a support for all the movable parts of the mechanism.

Figures 11, 12:
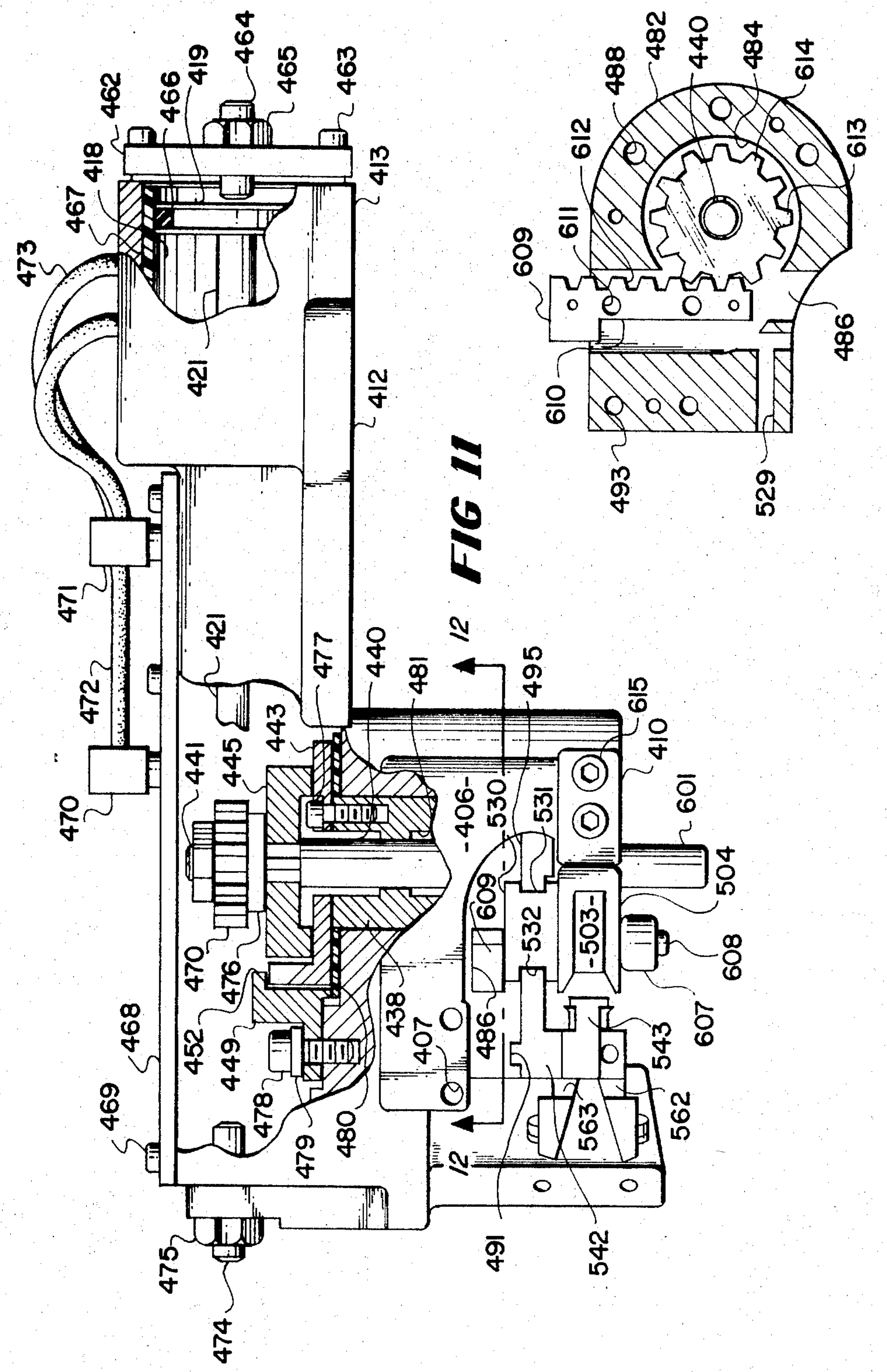
FIG. 11 is a top view of the transfer mechanism with portions in section.
FIG. 12 is a partial sectional view of the rack and gear arrangement of the transfer mechanism of FIG. 11.

Body 401 consists of a casting having a hollowed out main section 402 and extending flange portion 403, and a plurality of bores such as 404, 405, 405', 407', 409, 412', 417, 426', and 422'. On body 401 opposite flange 403 is located a cylinder housing 413 having cylinder chamber 418. Noted partially atop housing 413 and body 401 is a mounting flange 412 having attachment bore 412' therein. Mounted within hollowed out portion 402 is a stud receiving casting 416 having bore 417. This is used for attachment of a cap plate 468 as shown in FIG. 11. Cylinder chamber 418 is in communication with bore 422' and they receive piston 419 having piston rod 421 with notched area 422 thereon. Piston 419 is annularly relieved as at 420 to receive a sealing gasket. Piston rod 421 is adapted to project through bore 422'. Also within hollowed out portion 402 is flange 423' having mounting holes 426' therein. The opposite side of body 401 has a circular cut-out 414 in which is mounted a washer 480 as shown in FIG. 11. The area is further relieved to receive bearings bearing support member 438 having mounting holes 439 therein. Bearing member 438 receives shaft 440 as shown in FIGS. 10 and 11, the end of which is threaded as at 441 to merge with a key way slot 442. Washer 480 rests against circular shoulder 437 of the body. Located directly over shaft 440 on body 441 is flange member 406 having mounting holes 407 and 407' and a projection portion 408 having mounting holes 409. A key piece 410 is adapted to be secured to projection 408 and contains a retaining projection 410' in mounting holes 11, the latter adapted to match with holes 409 in projection 408.

Adapted to be mounted on face 437 is circular plate member 443 having mounting holes 447 in a central aperture 446 adapted to receive shaft 440. Member 443 has a flange 444 on one side thereof having a slot 445 therein. Referring now to FIG. 11 and FIG. 10, a key piece 449 having mounting holes 450 and 451 is adapted to be secured to the inner face of cut-out portion 402 by machine screw 478 and locking washer 479. Member 449 is a vertically arcuate section 448 and a flange lip 452. Flange lip 452 has a semi-circular notch 451 cut therein which is of the same general size as slot 445 in member 443. Adapted to be mounted onto shaft 440 for rotation therewith is circular member 455 having a bore 456 and a key way slot 456'. The outer periphery is notched as at 458 to receive a stop member 459 having to be fastened thereto. The outer periphery member 455 is notched as at 457 in a manner similar to the circular notch 451 in member 449. Also mounted for rotation with shaft 440 is spur gear 460 having teeth 461 in a central aperture 460' and key way 460'' adapted to receive key 454 to lock both spur gear gear and member 455 to shaft 440. As shown in FIG. 11, a nut secures both member 455 and gear 460 to the threaded end 441 of shaft 440. A bearing washer is also used such as 476 to separate member 455 from nonrotative member 443. Adapted to ride in slot 445 of member 443 in roller 453. Roller 453 is of slightly larger diameter than the transverse width of 445 which necessitates it protruding out into either notch 457 of member 455 or notch 451 of member 449. A machine screw such as 477 as shown in FIG. 11 is used to mount member 443 to the face 437 of the body 401.

A guide bar 423 having mounting holes 426 and 427 is adapted to be mounted within hollowed out portion 402 of body 401. Screws are adapted to pass through apertures 426 and guideway 423 and secure the guideway to flange 423'. Guideway 423 contains a guide slot 425 which is adapted to receive the smooth upper portion of a rack 428. The end of rack 428 has a square notch adapted to mate with a square notch 433 in locking member 431. Holes 430 and 432 in members 428 and 431 respectively, are adapted to receive the machine screws to lock the mating square notches onto the end of piston rod 421. The rectangular transverse projections on the end of both members 248 and 431 are adapted to grasp the notched area 422 in piston rod 421. The machine screws securing members 428 and 431 together also pass through and secures a stop member 437 to the lower portion of member 431. Member 437 is notched as at 435 and contains a threaded passage 436 for engagement by a machine screw. Member 437 acts as a stop member in conjunction with stop member 459 which is secured to the periphery of rotary member 455. The various components are shown assembled in FIG. 11. In the end of body 401 it is adapted to receive an adjustment stud 474 and locking nut 475 against which the end of member 428 abutts and the full travel of the piston is reached. As shown in FIG. 11, the piston 419 rides in chamber 418 which has a Teflon-like liner 467 and an end plate 462 which is secured against the end of chamber 418 by machine screws such as 463. An adjustment stud 464 and locking nut 465 are utilized to set the upper limit of the piston stroke. Relieved area 420 of piston 419 receives sealing gasket 466.

Figure 18:
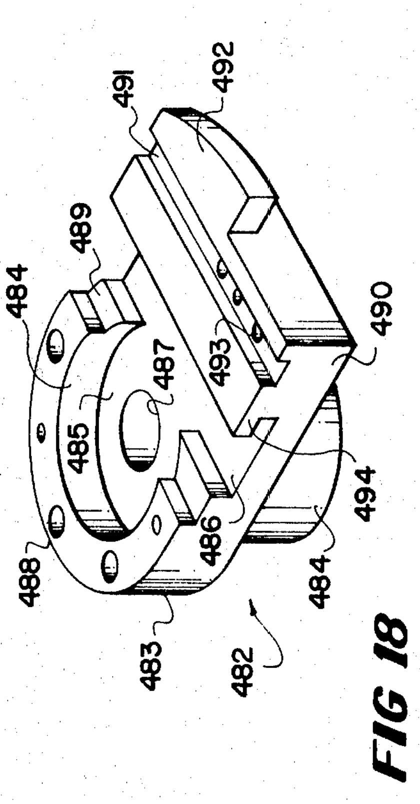
FIG. 18 is a perspective view of a block housing used in the transfer mechanism.

The piston is a double-action, positive piston inasmuch as it is directly forced in either direction through air entering through ports [not shown] from hoses 472 and 473 terminating in nipples 470 and 471. Referring now to FIG. 11, the shaft 440 is seen as protruding into a front portion of the mechanism under flange 406. Shaft 440 terminates within a chamber 481 in member 438 and is locked as shown in FIG. 12 onto a spur gear 613 having teeth 614. The spur gear is mounted for rotation with the end of shaft 440 and is adapted to engage teeth such as 612 in a second rack member 609. Rack member 609 is cut away as at 610 and contains mounting holes 611. Both spur gear 613 and rack 609 are mounted for rotative and linear movement, respectively, within a housing member 482 as shown in FIGS. 12 and 18. Referring now to FIG. 18 housing member 482 is shown to have a lower flange 484 and upper body portion 483. Portion 483 is arcuate shaped and is internally relieved as at 484 to provide a horseshoe-shaped upper projecting portion. The ends of the horseshoe portion are cut away as at 489 to provide a stepped effect. The member 482 is centrally bored as at 487 to receive the extension of shaft 440. Opposite the horseshoe-shaped portion is another flange portion 490 having a notch 491 with holes 493 therein and an arcuate projecting portion 492. Between the horseshoe shaped portion 484 and portion 490 is a flat centrally located surface 486 which is partially overhung by projection 494 of portion 490.

A cross section of member 482 is shown in FIG. 12 and illustrates the holes 493 and a passage 529 underlying slot 491 in portion 490. As shown in FIG. 12, the rack 609 and the gear 614 are mounted with reciprocal and rotary motion, respectively.

Figure 17:
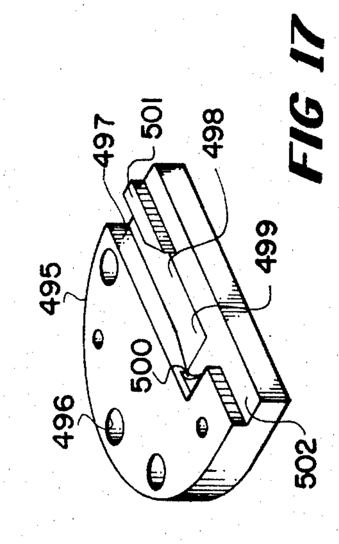
FIG. 17 is a perspective view of a slotted cap forming a portion of the transfer mechanism.

Referring now to FIG. 17, the covered plate which mounts on top of portion 483 of member 482 is shown. It consists of a semi-circular shaped member 495 having mounting holes 496 adapted to align with mounting holes in the top of horseshoe shaped portion 484 of member 482. The top portion is cut away as at 502 and at 498 to provdie an upstanding projection 501. The member is relieved on a deeper level at 498 as it is at 502, and a merging surface 499 is provided. Also, a small portion is left as at 500 to allow for a pin, as shown in FIG. 14, as 606 to ride on surface 502 and be guided by arcuate notch portion 500 and then down onto surface 499 and finally surface 498.

Figure 14:
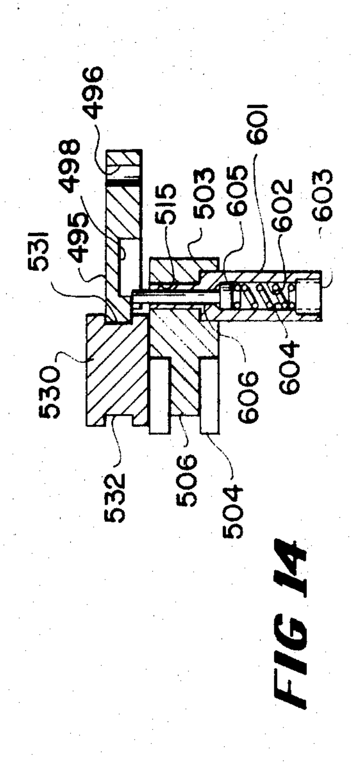
FIG. 14 is a partial sectional view of portions of the transfer mechanism.
Figure 19:
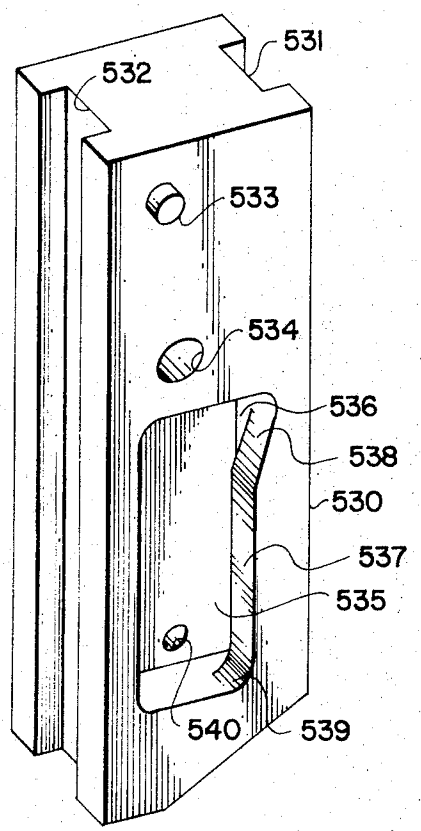
FIG. 19 is a perspective view, partially broken away, of a slide used in the transfer mechanism.

Referring now to FIGS. 14 and 19, a guide member 530 is shown which is adapted to operate at the edge of cover member 495 as seen in FIG. 17. FIG. 14 shows the interrelationship of guide member 530 and FIG. 19 shows the detail thereof. Member 530 is shown to have oppositely disposed notches or slots 531 and 532. It also contains projection 533, bore 434, and a centrally relieved area 535. The relieved area is slightly overhung by a lip having bevelled surface 538, flat cam surface 537, and curved surface 539. There is a small area 536 between surface 535 and the surfaces 538, 537, and 539. Central bore 540 is located near the lower portion of relieved area 535.

Figure 20:
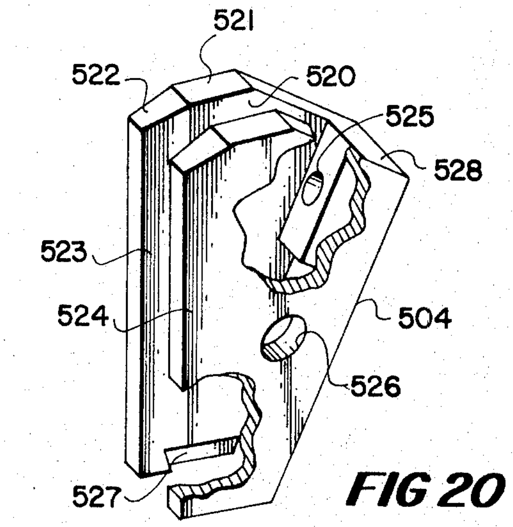
FIG. 20 is a perspective view, partially broken away, of a guide used in the tranfer mechanism.
Figure 22:
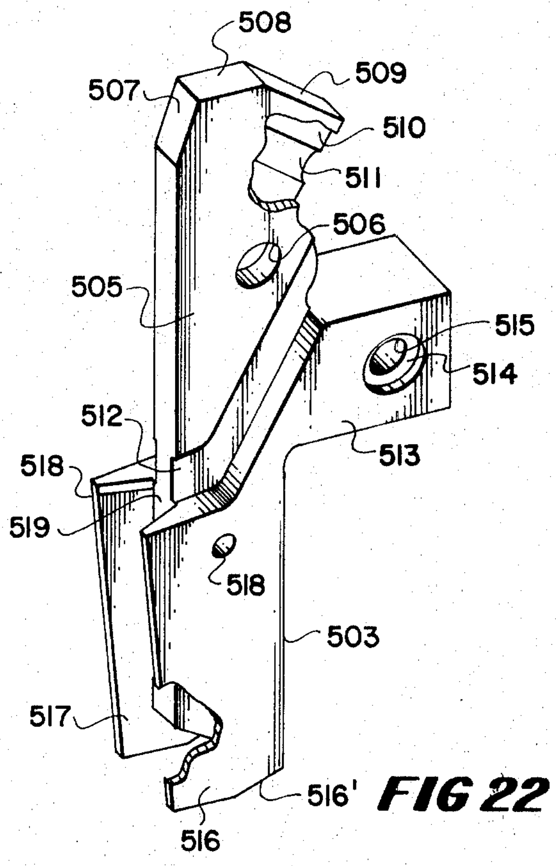
FIG. 22 is a perspective view of a bar used in the transfer mechanism.

Also mounted atop guide member 530 and overhanging cover plate 495 are a pair of members shown in FIG. 20 and 22 and are designated generally as 504 and 503, respectively. Member 504 has a central bore 526 and two wing portions 523 and 524. These portions are bevelled toward their extremities as shown by upper angle surface 522 which connects with front portion 521. The wing portions are connected by a central portion 528 having a bore 525 therein. The lower portions of wing portions 523 and 524 are inwardly bevelled as at 527.

Member 503 has a central projecting portion 513 having a counter-bore 514 and a through-bore 515. The lower part of member 503 has wing portions 516 and 517 which are tapered as at 518. They are connected by central portion 512 and have a bore 518 passing therethrough. The lower portions of wings 516 and 517 are inwardly bevelled as at 516'. Central portion 519 is notches as at 512 and the notched area continues upwardly to the top of extending portion 513. Portion 519 continues upwardly as at 505 and is bevelled as at 507 and 509 and said bevelled surfaces being joined by the central flap portion 508. The front of portion 505 is cut away inwardly to provide a bore 511 in slot 510. The slot 510 is in open communication with bore 511. Central aperture 506 is found in portion 535 of guide member 530 and thereby commences to drive guide member 530. Guide member 530 is driven between the edge of plate 495 and the edge of plate 542 as shown in FIG. 11. Slots 531 and 532 of member 530 provide for lateral movement on said edges. The pin connecting members 504 and 503 together also passes through bore 534 and member 530 and the relieved portion 541 in wing 523 of member 504 receives stud projection 533 of member 530. Thus it is seen that members 504, 503, and 530 move as a unit. Stop member 583 is biased upwardly against the lower portion of 530 and 503 by a spring [not shown] and is moved downwardly as member 402 is rotated.

Continued rotation of member 543, as already stated, drives members 503, 504, 530 along the edge of member 482 through the action of spur gear 614 in rack 609. During the lateral movement of member 530, pin 606 of plug member 605 rides along surface 502 of plate member 495.

Figure 16:
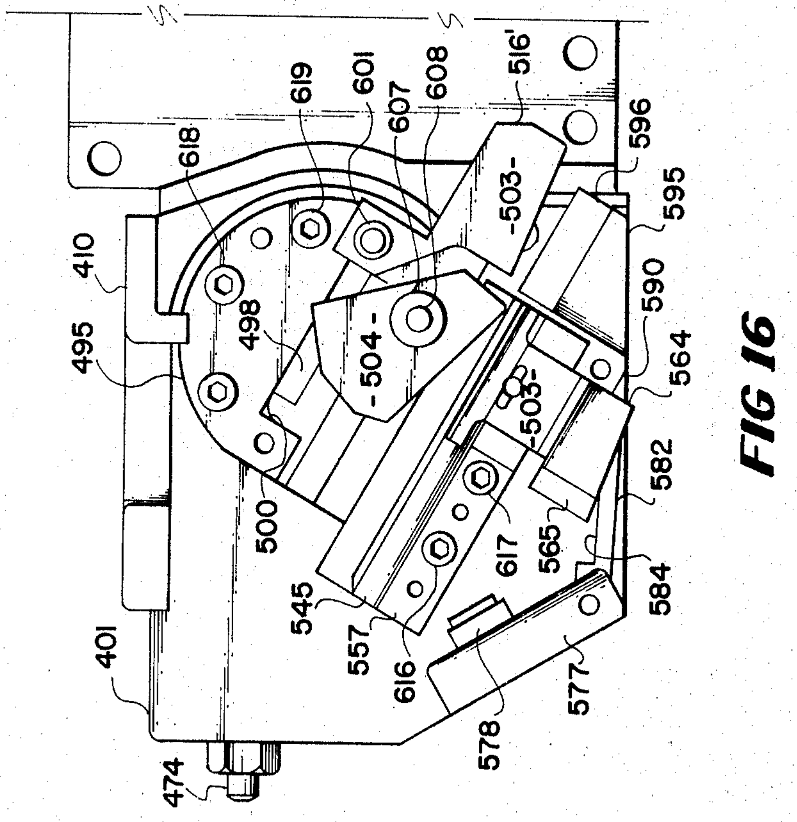
FIG. 16 is a front view of the component transfer mechanism in fully rotated position.

Mounted on member 401 at its lower edge is a vacuum block 590 having mounting holes such as 599 which are counter-bored as at 600. MOunting block 590 has various bevelled edges such as 591, 592, and 593. An upstanding projection 594 carries the vacuum housing 595 which has bores such as 597 and 621 therein. A slot 598 is mounted along the same face containing bores 621 and 597. The vacuum housing is bevelled as at 596 so that it fits between wings 516 and 517 of member 503. As shown in FIG. 16, the wings of member 503 are adapted to ride over and slightly on each side of vacuum housing 595. As member 455 continues rotation of shaft 440 guide member 530 continues to move along the edge of plate 495. Pin 606 goes beyond the projection 501 of plate 495 and allows the member 503 to rotate slightly as the pin snaps up in a position to engage surface 498. Such an action lifts wings 516 and 517 off of the vacuum block thereby allowing a component of the insertion mechanism to pick up the component and transfer it thereto. Such a transfer is not accomplished, however, until the piston 419 is again activated in a reverse direction. Members 504, 503 and 530 move to their initial position on member 482 and member 482 is again rotated to the position shown in FIG. 13. The components are held on the vacuum block by a vacuum being applied through bores 621 and 597. Regardless of the number of leads of the component the slot 598 and bores 597 and 621 of the vacuum housing 595 always positions the forward edge of the component in the same position. As shown in FIG. 16, member 503 is allowed to bias upwardly slightly. Member 504 has its lower edge of wings 523 and 524 biased in the opposite direction, thereby preventing any further components from sliding out of the transfer mechanism onto the vacuum block. Whem member 482 is again rotated to the position shown in FIG. 13, member 504 and 503 are placed in their normal position allowing their second component to drop down between flippers 562 and 563 and wings 516 and 517 of member 503. Thus the transfer mechanism is in a position to receive another component between wings 523 and 524 of member 504 and guide plate 543.

Figure 13:
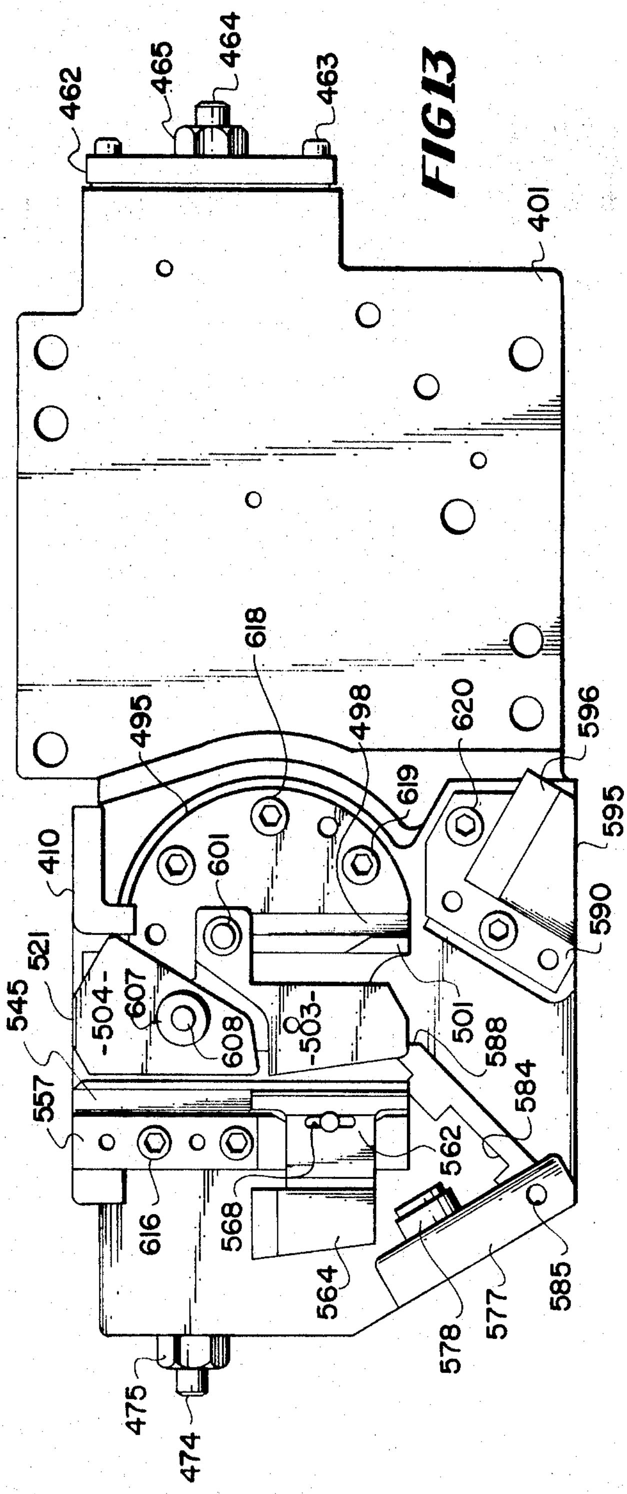
FIG. 13 is a plan view of the transfer mechanism.
Figure 15:
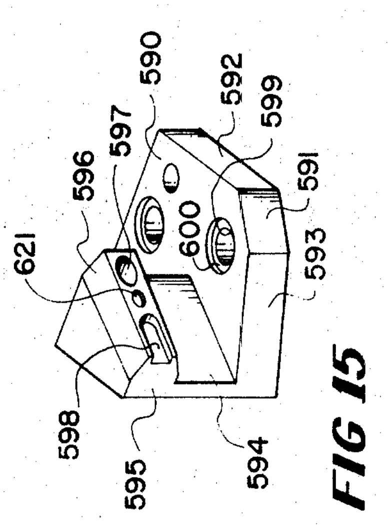
FIG. 15 is a perspective view of the vacuum block used to hold components.

During reverse rotation of shaft 440, member 503 is held in a position shown in FIG. 16. In other words, the lower portion is outwardly biased as pin 606 rides upwardly on the surface 498 until it rides up surface 499 and is guided therearound by arcuate surface 500 back onto surface 502. At that point, members 503 and 504 assume their normal relationship as shown in FIG. 13. A stop member 410 is shown in FIGS. 16 and 13 and is provided to prevent any further biasing of member 504, the edges thereof are shown resting against stud member 410 in FIG. 13. In FIG. 13 two components would be positioned therein, the lower component being held from dropping out of the transfer mechanism by stop member 584 which also serves to stop member 530 and the transfer mechanism from rotating any further than the position shown in FIG. 16. Thus when a complete cycle has been accomplished, the transfer mechanism retains one component in a position to have its leads biased outwardly by the flippers and the prior component is resting atop vacuum housing 595 ready for pick-up by the insertion mechanism. Since the relieved area 541 on member 504 is larger than projection stud 533 and member 530, it allows for slight rotative movement of member 504 as shown in FIG. 16. A lock washer such as 607 secures pin 608 to members 503, 504 and 530. To accomplish the reverse rotational biasing of members 503 and 504 a compression spring is located within bore 511 of member 503 and bore 525 of member 504. When the components 503 and 504 are in normal position as in FIG. 13, this spring is in a compressed condition with the bevelled face of member 503 meeting the top face of portion 528 of member 504. When pin 606 goes beyond the lower limit of projection 501, as shown in FIG. 17, of plate member 495, this allows the member 503 to bias outwardly. Since a component is no longer positioned between members 504 and flippers 562 and 563, this allows component 504 to rotate slightly to the position shown in FIG. 16. The stop member 410 allows a component of member 504 to assume the position shown in FIG. 13 by its abutting action on the point edge of member 504 when member 482 has completed its reverse rotation to its initial position.

Figure 28:
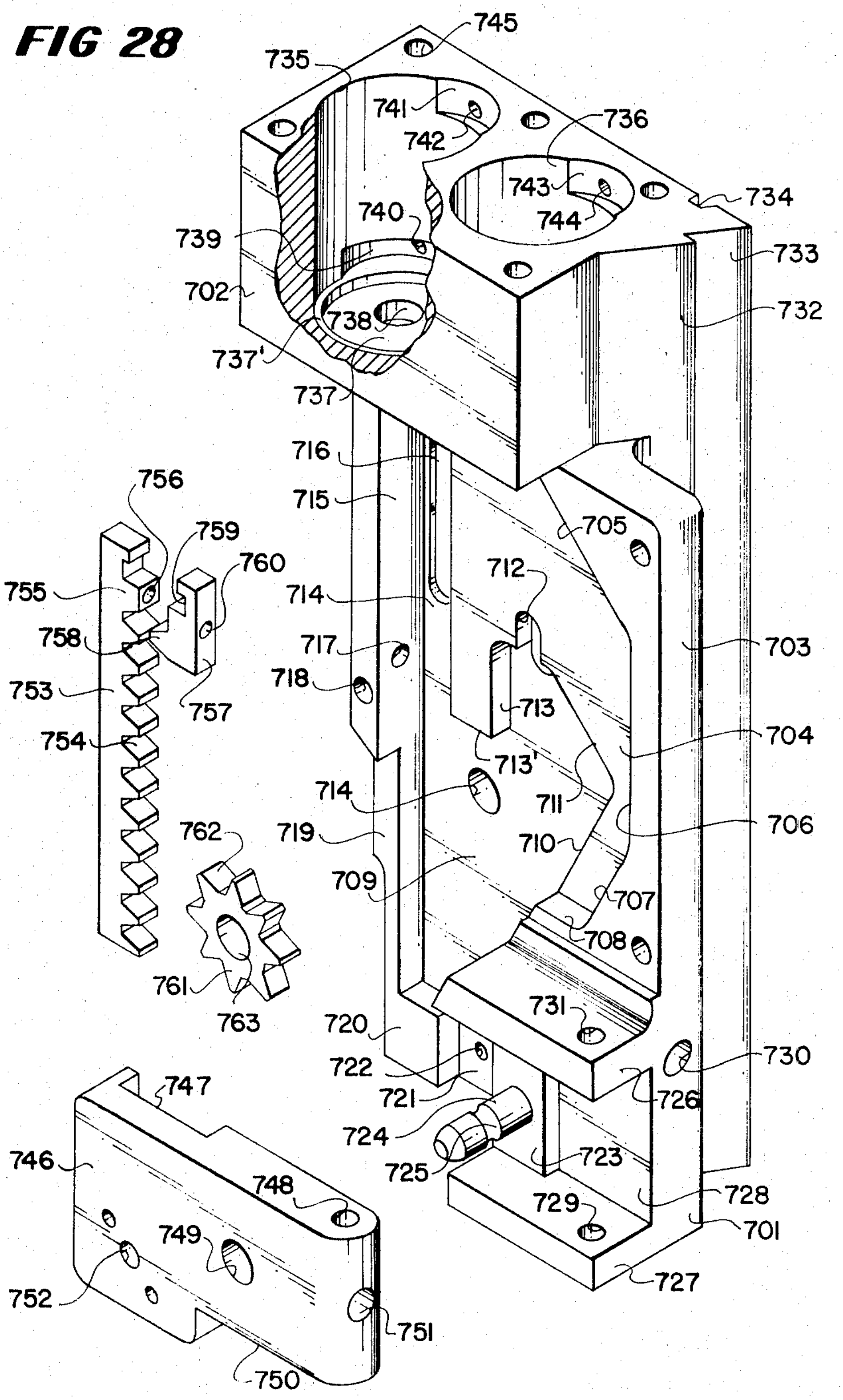
FIG. 28 is a perspective view partially broken away, showing the main slide housing of the insertion head with some parts in exploded view.

Referring now to FIGS. 26–33, there was shown the insertion mechanism, generally designated as 700. Referring now to FIG. 28, there was shown the main housing 701 containing the insertion mechanism. It consists of a main support portion 703 and an upper piston housing 702. Support portion 703 is internally relieved to provide an inner surface 704 with walls 705, 706, 707, and 708. Surface 704 is further relieved to provide an additional flat surface 709 having walls 715, 713, arcuate walls 712, 711, 710. A passage 714 is located on surface 709. Wall 715 has a bore 717 therein and the top surface thereof, which is level with the flat face of portion 703, has a passage 718 therein. On the same plane with surface 704 is a continuation surface 719 terminating in portion 720. On the lowermost portion of portion 703 are a pair of projecting portions 726 and 727, each containing aligned bores 731 and 729. A raised portion 723 contains a locking stud 724 having an annular recess 725 therein. The area between projecting portions 726 and 727 is designated as 728. Housing 703 has a bore 730 therein adjacent projecting portion 726. Intermediate raised portion 723 and portion 720 is portion 721 having a bore 722 therein.

Cylinder chamber housing 702 has a pair of cylinder chambers 735 and 736 therein. Each chamber is a dou- 505. A pin, as shown in FIG. 11, is adapted to mount member 504 onto portion 505 of member 503 and pass through bores 526 and 506, respectively.

Figure 21:
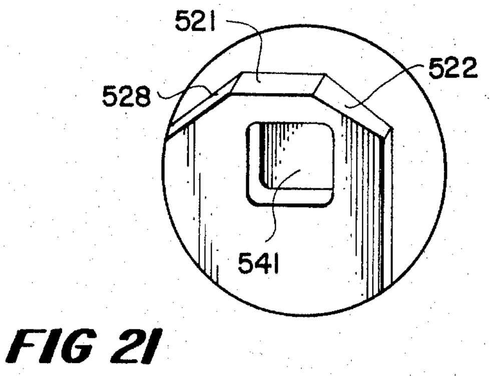
FIG. 21 is a partial view of a slot in one face of the guide of FIG. 20.

As shown in FIG. 14, member 504 receives a plug member 605 which has an extending portion 515 of narrow diameter which is received in bore 515. The plug 605 resides in counter-bore section 514 and has a hollow bore 602 therein which receives a compression spring 602 secured therein by tapped plug 603. The piston 606 is adapted to project through the small diameter portion of plug 605 and ride on surfaces 502, 499, and 498 of cap member 495. Plug member 601 can be seen through FIGS. 16 and 11. Referring now to FIG. 21, it is seen that the reverse side of wing 523 has a rectangularly shaped relieved portion 541 therein.

FIG. 13 shows the connecting members 503, 504 and 495 in their starting position. This position is where the transfer mechanism receives a component dropped in from the shuttle member.

Figures 23, 24, 25:
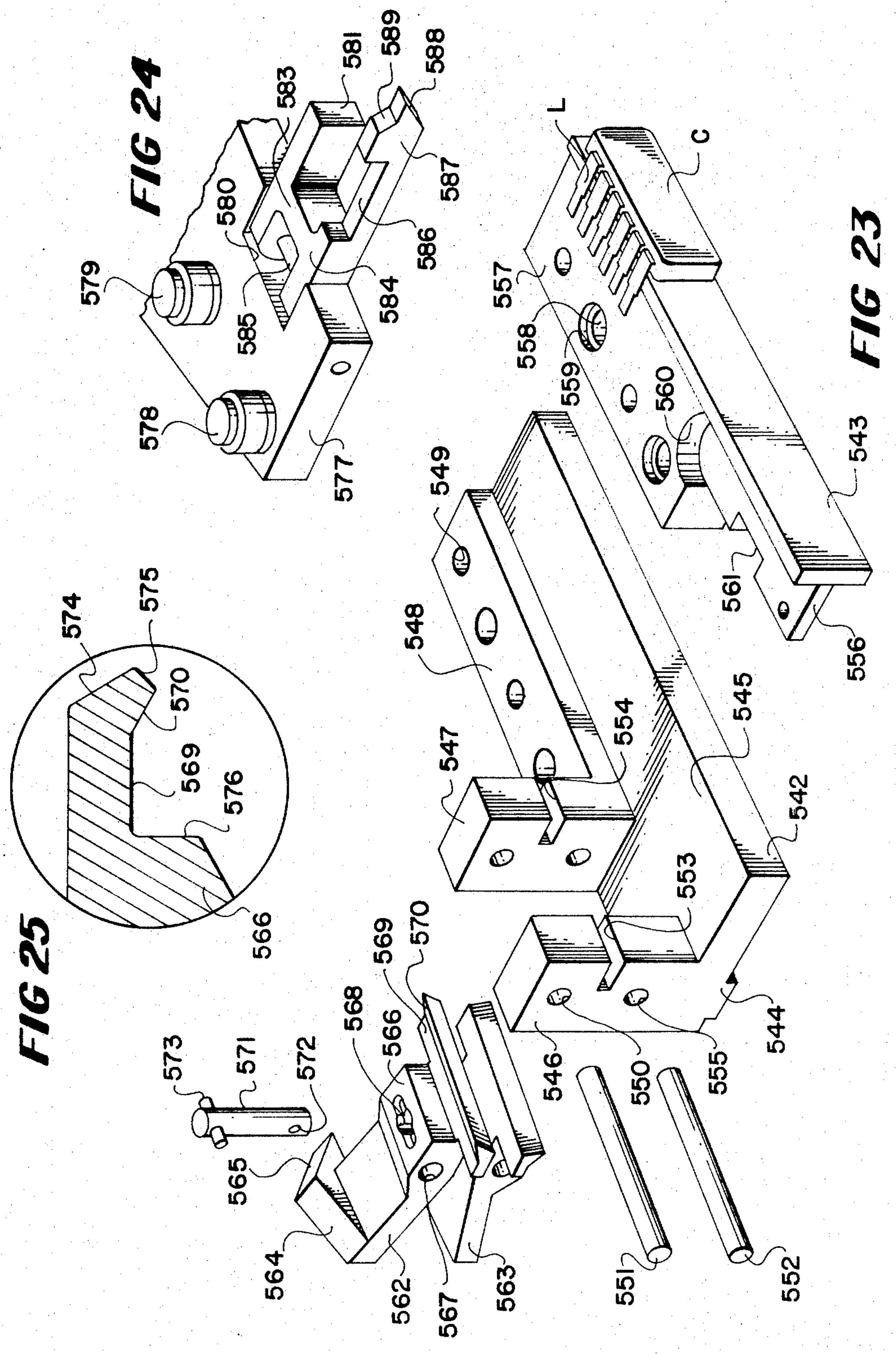
FIG. 23 is an exploded view of a portion of the transfer mechanism showing the wipers, plate and guide.
FIG. 24 is a perspective view of a pivoted stop member employed in the transfer mechanism.
FIG. 25 is a partial view showing the cross-sectional configuration of the wiper blades of FIG. 23.

Referring now to FIGS. 23 and 25 there is shown the lead biasing mechanism. The arrangement consists of a support plate 542 having a lower longitudinal projection 544 which is adapted to ride in slot 491 of member 482. The member 542 has an upper planar surface and a pair of upstanding projection portions 546 and 547. Each projecting portion has a pair of aligned bores such as 550 and 555 and aligned slots such as 553 and 554 therein. A mounting flange 548 is provided adjacent projecting portion 547 and contains mounting holes 549. Adapted to be mounted at the top of flange 548 is a guide member 557. It has a series of mounting holes such as 558 and which are counter-bored as at 559 to receive machine screws. A guide plate member 543 which is secured along one edge thereof, forms the "T" with extending portion 556 which is notched at 561 and merges with the main body of member 557 at arcuately relieved area 560. Guide plate 543 provides a surface in which a component C rides along with its leads L extending over the edges thereof.

When member 557 is mounted atop member 542, passages such as 549 and 558 are aligned. Slots 553 and 554 have projections 546 and 547, respectively, and receive projecting plate portion 556 and notch 561 is mounted between portions 546 and 547.

Adapted to be mounted between portions 546 and 547 are a pair of flippers 562 and 563. Each flipper is identically but oppositely shaped. Flipper 562 has converging planar surfaces 564 and 565 on an extension portion thereof. A central body portion of flipper 562, 566, has a longitudinal bore 567 therethrough and a vertical bore 568 therethrough. Located and attached to body portion 566 of fliper 562 are activating extension portions 569 having upwardly bevelled portion 570. Adapted to pass through vertical bore 568, both in flipper 562 and flipper 563, is a central pin 571 adapted to be locked therein by retainers such as 573 passing through holes in pin 571 such as 572. As can be seen, the upper portions of this vertical bore such as 568 are notched so that the pin such as 573 may lie flush in body portion 566. Pins 551 and 552 are adapted to pass through bores 550 and 555 and through bores in the flipper portions such as 567 to maintain them therein. The actuating portions such as 569 are adapted to overlie plate projection portion 556 on either side thereof. As the component C moves along guide plate 543, the bevelled portions 570 of each flipper engage the bottom of the leads L and move them outwardly. Such an action is caused by the cam surfaces such as 564 and 565 passing between pin rollers 578 and 579 as seen in FIG. 24. As the cam surfaces pass between, the accompanying ends of the flippers are compressed together, thereby separating or tending to separate portions 569 of the flippers which force surfaces 570 to engage the undersigned of the component leads L.

As shown in FIG. 25 the body portion 566 is shown to have a shoulder 576 which is curved into flat portion 569 and unbevelled portion 570. A tip portion surface 575 connects with converging bevelled portion 575 and the point of juncture between surfaces 570 and 575 engages the leads initially. As the flippers are biased outwardly to spread the leads L the point contact becomes a surface contact as the extremities of the leads ride along surface 575.

FIG. 24 shows plate 577 which contains rollers 578 and 579. The plate is cut away as at 580 to provide access for a stop member 584 which is held therein by pin 585. Stop member 584 is 8-shaped with a connecting portion 583. One of the portions is is terminated as at 581 and the other is relieved as at 586 which merges into stop portion 587. Stop portion 587 is cut as shown in FIG. 24 to provide an outer bevelled surface 588 and an upper bevelled surface 589. The plate is mounted on the reverse side of body portion 540 as shown in FIGS. 16 and 11.

The operation of the mechanism is as follows: referring to FIGS. 10 and 11, piston 419 is activated as causing piston rod 421 to move rack 428 toward stop stud 474. Since the rack is engaged with spur gear 460 the gear, which is keyed to shaft 440, turns shaft 440 which in turn turns member 455. During the initial part of rotation of member 455, pin 453 rests against the sides of slot 445 in member 443 and slot 457 in member 455. This causes member 443 to rotate, thus in turn causing member 438 to rotate. At the start of rotation, the mechanism has a configuration as shown in FIG. 14. Member 438 is, in actuality, the lower flange portion 484 of member 482. Thus the initial rotation with member 455 causes member 482 to rotate. Rotation of member 482 causes the entire component mechanism including components 504 and 503, 495, 557, and 542 to rotate therewith. At this point the component is held on guide plate 543 by wing portions 523 and 524 of member 504. Actually two components are in position between plate 543 and member 504. As the rotation proceeds, cam surfaces such as 564 or flippers 562 and 563 pass between rollers 578 and 579 thereby biasing the leads of the lower component outwardly. The lower component is held between wing portions 516 and 517 of member 503 and plate member 543. As the rotation continues, referring again to FIG. 10, the pin 553 and slot 445 come opposite notch 451 in member 449 and the pin shifts slightly laterally into slot 451 while member 455 continues its rotation. Thus member 443 and consequently member 482 are no longer driven by the rotation of member 455 and they stop rotation. However, shaft 440 continues to rotate which in turn begins relative movement between gear 614 and member 482. Spur gear 614 commences to drive rack 609 which has a pin [not shown] therein mounted in the holes 611. The pin engages the flat relieved area ble acting chamber and has arcuate sections such as 741 and 743 at the top thereof with inlet bores 742 and 744, respectively. Both chambers are identical, however, chamber 735 will be described. The lower portion of chamber 735 has an arcuate relief section 739 with a inlet for exhaust bore 740 therein. The bottom of the chamber is counter-bored as at 737 to provide a shoulder 737' and has a passage 738 for the piston rod. The top housing 702 has a plurality of threaded bores such as 745 for attachment with a cover plate thereto. The rear of housing member 701 is notched as at 734 on one side and has an accompanying notch [not shown] on the other side. The housing is slightly bevelled outwardly as at 732 and at 733 to provide a stepped effect. This portion of the housing is adapted to ride in a slide-way; in other words, the entire housing 701 is adapted to reciprocate vertically between a transfer position and an insertion position. Adapted to be mounted on surface 709 is spur gear 761 having gear teeth 762 and a through-bore 763 through which a pin passes and secures it and passes into bore 714. Spur gear 761 is adapted to mesh with a rack 753 having rack teeth 754 thereon. Rack 753 has a raised portion 755 with a bore 756 therein which is adapted to receive a pin passing through bore 760 and locking stud 757. Locking stud 757 has one tooth 758 adapted to mesh with one of the teeth of rack 753 and a notched area 759 adapted to cooperate with the notched area of the rack 753 to grasp the end of a piston rod.

Latch member 746 is adapted to be mounted on the lower portion of the housing and has a passage 758 through which a pin passes to hingedly connect the latch to projections 726 and 727 of the housing. The pin also passes through passages 731 and 729 thereof. The latch has a longitudinal bore 751 therein and a locking portion 759 through which locking stud 724 is adapted to project when the latch is in closed position. The reverse face of latch member 746 is cut away as at 474 for the purpose to be described. The latch is further relieved as at 750 and has a central passage 752 for the purpose to be described.

Referring now to FIG. 29, is shown in exploded view the various components. The insertion mechanisms are adapted to lie on surface 704 and surface 709. A main drive member 764 has an arcuate upper surface 766 and a bevelled depending surface 765. A cam guideway 769 is cut therein to provide surfaces such as 769' and arcuate surface 770 and stop surface 770. The latching member also contains bores such as 774 and 775 adjacent to vertical edge surface 768. The central portion 772 of member 754 has a notch 773 having upper and lower rounded arcuate surfaces 773' and 773'' and a relieved area 771 which merges with a portion of the slot. The lower portion of member 754, namely 775, is relieved on both sides (only one is shown) such as 776 and further relieved as at 777. A pair of bores are provided in each leg of portion 775, namely 779 and 778.

Adapted to be attached to portion 775 is a lead guiding member 780 having an upper projecting portion 784 with a bore 785 therein, and attachment holes such as 786 adapted to align with holes 778 and 779. The member 780 is relieved as at 783 to provide a pair of depending guide members 781 and 782. Internal faces of the guide members, as at 787, are provided with a plurality of bevelled guiding notches such as 788.

Adapted to fit up, under and around the sides of portion 775 of member 780 is a stirrup 790 having flat, transverse section 789, bevelled portion 792, upwardly projecting portion 793 and T-shaped tab portions 791 and 794.

Adapted to be mounted to holes such as 774 and 775 and member 764 is a keeper piece 808 having a bevelled portion 809 and projection portion 810. A series of passages such as 811 are adapted to receive screws mounting the keeper piece to portion 772 of member 764. Also adapted to be fitted within keeper piece 808 and attached to member 764 is a small rack member 812 having a connecting bore 814 and teeth 813.

A pair of jaw members such as 797 are adapted to be fitted to the housing on either side and lower than member 780. One such member is attached to the housing directly in the area of flat surface 721 of the housing and the other jaw member is adapted to be fitted within the notched area 747 on latch member 746. Each jaw member has a upwardly projecting portion 798 with the central bore 779 having a counterbore as at 800 and a connecting passage 801. The lower portion of each jaw member is tapered as at 803 and further tapered as at 804 to terminate in a flat, lead engaging surface 807. Lead engaging surface 807 has a plurality of triangularly or truncated shaped guiding jaws such as 805, each having a bevelled surface which converges toward the bevelled surface at the adjacent jaw. A further connecting bore 802 is provided in each jaw member for attaching it to either the latch member or the housing itself. The jaw members are attached permanently to the housing 701 and are adapted to ride up and down with it, whereas member 764 and member 780 are adapted to move within the housing relative to the housing and each jaw member.

FIG. 30 shows a cross section taken along lines 30—30 of FIG. 29 and shows an internal bore 795 within member 775 and a smaller bore 796 for attachment of a pneumatic line thereto. The purpose of this will be described hereinafter.

Figure 31:
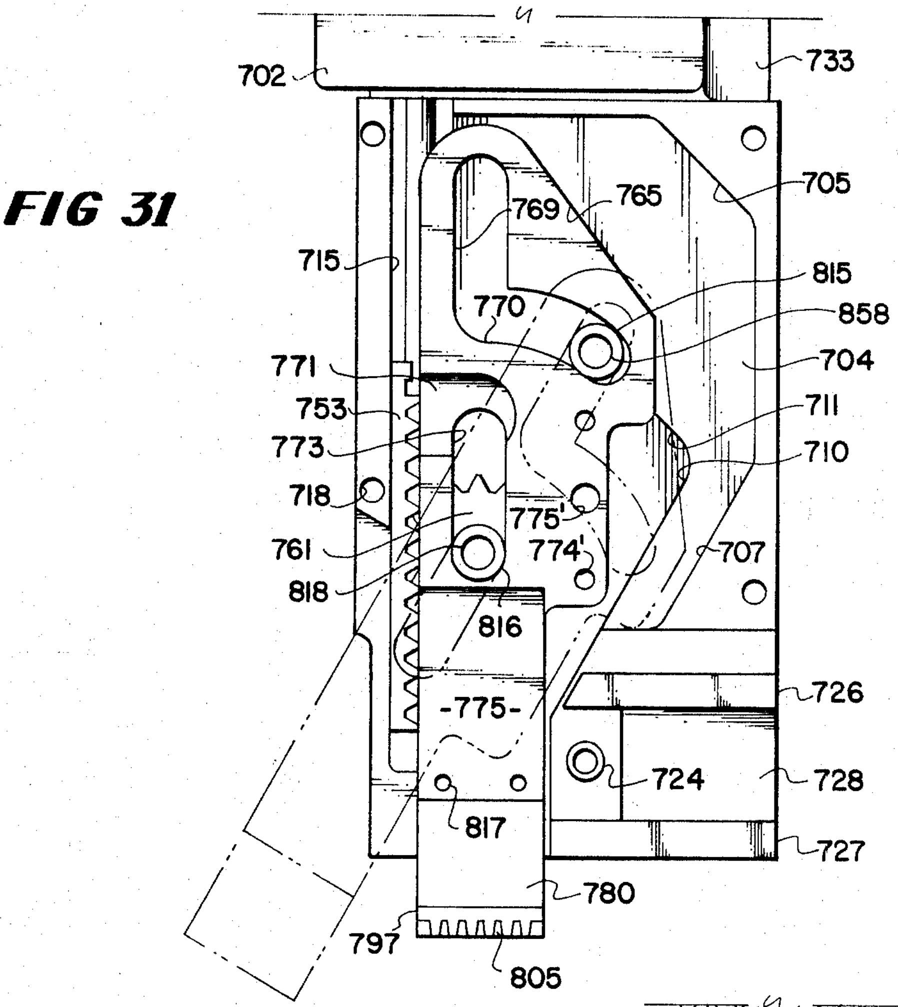
FIG. 31 is a front view with parts removed of the lower portion of the insertion head.

FIG. 31 shows the various components in their assembled condition. Member 764 is shown as fitting within housing 701 and a pin 858 having a roller 815. Pin 858 passes through the arcuate area 712 and into a passage [not shown] in FIG. 28. It remains stationary and rides within groove 769 of member 764. Member 764 is shown in the beginning of its insertion position in FIG. 31 and shown in phantom lines in the beginning of its pickup and transfer position. As shown, rack member 753 rides along face 715 of the housing and engages spur gear 761, which has a pin passing therethrough with a roller 816 thereon. Roller 816 rides within slot 773 of member 764 and controls the extent of its vertical up-and-down movement and its up-and-down movement in the insertion position, and up-and-down movement in the transfer position. Rack member 812 is mounted on the opposite side of member 764 as shown in FIG. 731, and also engages the spur gear 761. The relative position of the guide member 780 is shown in relation to the latch member 724. Depending below the bottom of the guide member 780 is shown one of the draw members 797 with guiding teeth 805.

Insertion member 764 is in its insertion position, and to accomplish actual insertion of the component the entire housing cylinder 701 moves downwardly. When insertion is accomplished, the housing moves upwardly whereupon member 764 begins a sideways, downward movement toward the left, as viewed in FIG. 31, to engage and pickup a component off the vacuum block of the transfer assembly. To accomplish such a movement spur gear 761 is rotated, thereby moving the member 764 downward relative to the housing 701. However, because of the action of roller 815 within slot 769 the member 764 begins to rotate clockwise until roller 769 can pass into the upper extremities of slot 769. In other words, the member first begins a slight downward rotative movement culminating in a straight, downward movement in the position shown on the phantom lines. This further downward movement is also accomplished through the action of the spur gear, and rack member 812 mounted on the opposite of member 764.

Figure 32:
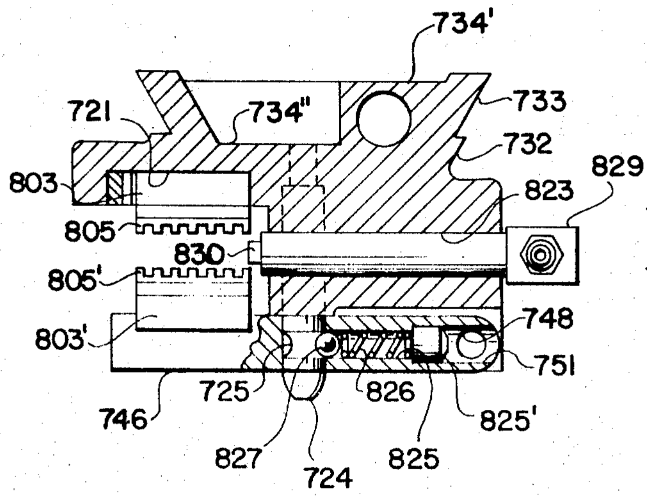
FIG. 32 is a cross sectional view of the lower portion of the insertion head showing the insert jaws.

FIG. 32 shows a cross section of housing 701 showing the trapezoidal type, rear configuration and a central notch 734 upon the rear of housing 701. The housing is further relieved as at 734::. The cross section was taken from the axis of bore 730 and shows a pneumatic tube 823 within bore 730 having a connection 829 and a sensing tip 830. The function of this arrangement is for tip 830 to sense when a component has been picked up and is in position. Shown mounted within area 721 is jaw member 797, shown mounted within recess 747 of latch member 746 and is shown in oppositely configured jaw 797:. Mounted within bore 751 of latch member 746 is a stop member 825: which seals a compression spring 826 within a smaller bore 825. this spring acts against a ball 827 mounted in the end of passage 825. The end of passage 825 is tapered inwardly slightly, although not shown on the drawing, only to prevent the ball from exiting through passage 825 when the latch is swung outwardly off of locking stud 724.

Figure 33:
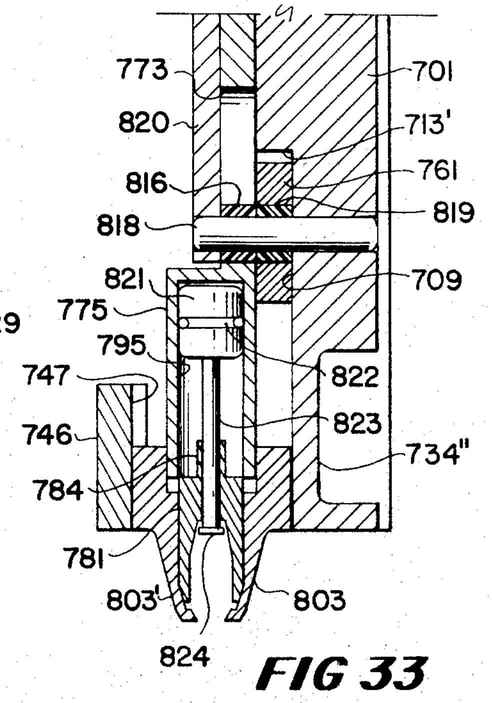
FIG. 33 is a sectional view of the lower portions of the insert head showing the insertion piston.

A cross section of the lower portion off the housing 701 is shown in FIG. 33. The lower portion 775 of member 764 is shown to have a central passage 795, as shown in FIG. 30 also, within which a piston 821 having an annular groove 822 and sealing link is adapted to move. Piston 821 has a piston rod 823 which abutts the lower flat portion 789 of stirrup 790. The jaw members 797 and 797: are shown surrounding the guide member 781 and an insertion position is reached, in other words, the housing 701 has reached its lowermost point. Piston 821 is activated, thereby pushing down on stirrup portion 789 to thrust the component into a printed circuit board or the like. Also shown in FIG. 33 is a cross section 818 and its roller 816 and spur gear 761 mounted on pin 818 and having a bushing 819. As can be seen from the drawings, roller 816 is free to move within slot 773.

Referring again to FIG. 31, it is seen that as rack 753 is moved upwardly and downwardly spur gear 761 rotates, thereby engaging rack 812 and moving or tending to move the member 764 upwardly or downwardly and consequently rotating it to transfer position. Pin 858 is somewhat spring loaded within its passage underlying notched area 712 so that once member 764 reaches the position shown in phantom lines in FIG. 31, further rotation of spur gear 761 moves the member downwardly in the arcuate direction shown until roller 815 engages the top portion 769: of slot 769. This is to engage the device over the component on the vacuum block or vacuum housing of the transfer mechanism. There is sufficient clearance for the guide lead member 780 to swing out of the position shown in FIG. 33 between the jaw members 797 and 797:. To insure against binding, a slight tolerance is provide as shown between the lower portions of member 775 and the upper internal notched portion of the jaws. Also, the ends of the depending portions 781 and 782 terminate short of the upper portions of the guide jaws 805 to allow for this swinging movement.

Figures 26, 27:
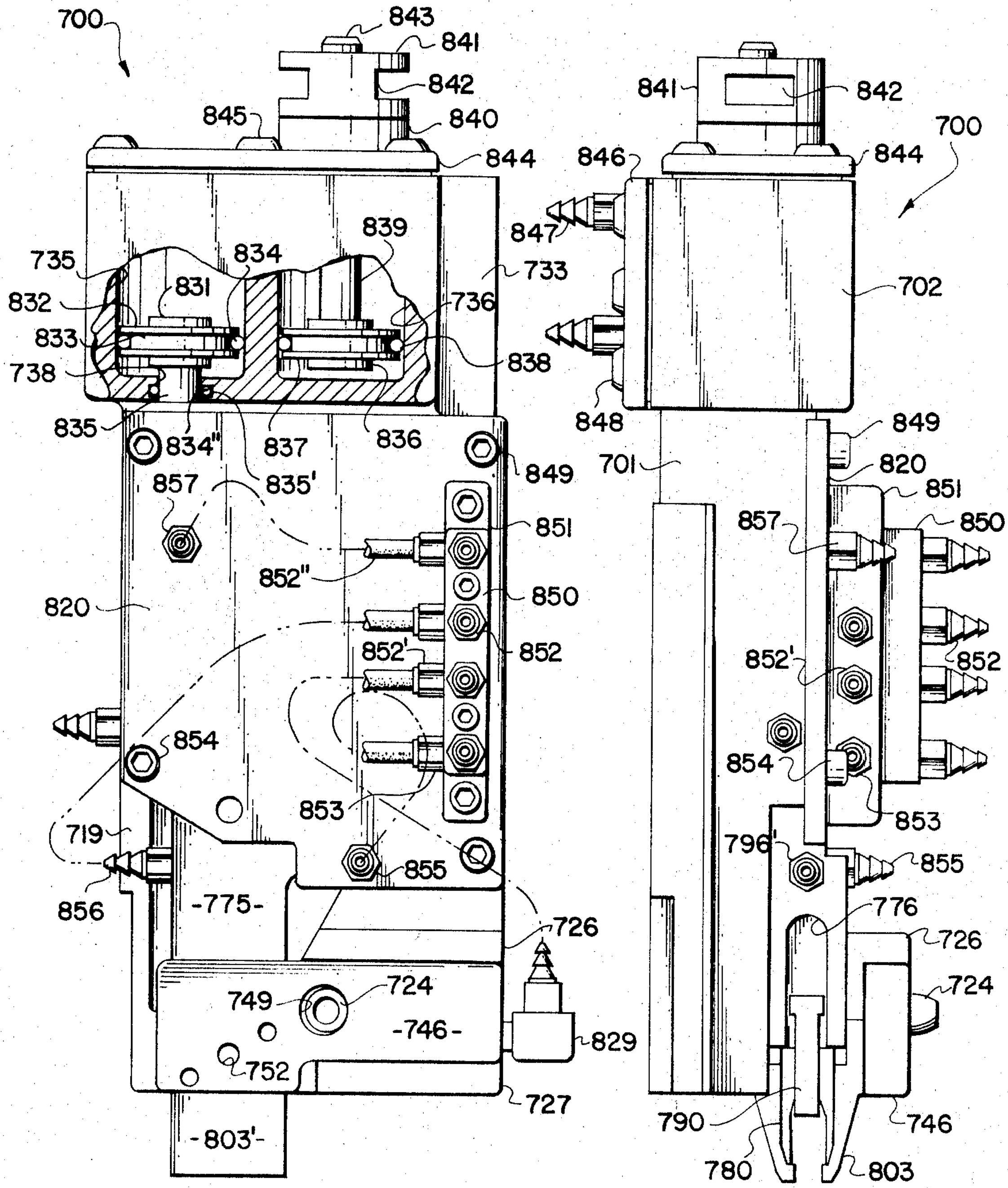
FIG. 26 is a plan view with parts in section of the insertion.
FIG. 27 is a side view of the insertion mechanism shown in FIG. 26.

Referring now to FIGS. 26 and 27, there are shown pistons such as 831 and 836 for accomplishing the various movements of the insertion mechanism. Piston 831 rides within chamber 735 and has flanges such as 832 and an annular section 833 in which is mounted a sealing gasket 834. The piston rod 835 which is connected to rack 753 is secured against leakage by internal groove 835: containing a sealing gasket 834::. Similarly, piston 836 is provided with a sealing gasket 838 when it moves its piston rod 839 within chamber 736. Cover plate 844 is secured to the top portion 702 by rivets or machine screws such as 845. Mounted on the opposite end of piston rod 839 is a notched member 841 having notches such as 842 and a stop member 840. As piston 836 moves upwardly within chamber 736, member 841 also is adapted to move upwardly. However, in actual use member 841 is adapted to engage through its notch 842 a stationary portion of the entire component insertion apparatus, thereby allowing housing 701 to move up and down through the action of the chamber 736 sliding on piston 836. It is locked in the vertical up-and-down position through the interengagement of projections such as 733 within a guide member [not shown]. A cover plate 820 is secured by machine screws such as 849, 854, onto the front of the housing and additionally contains a pneumatic block connection 851 for securing pneumatic block 850 to the housing. A plurality of fittings such as 852, 852: and 853 connect with various hoses such as 852::. A nipple 857 is located on the face of member 820 and serves as a sensing mechanism to sense the position of member 764.

In FIG. 27 the location of stirrup 790, jaw member 797, and latch guide member 780 are shown in side view. Fittings such as 796:, 855, and 856 are for various sensing purposes. A fitting such as 847 [not shown] in FIG. 27 conduct or exhaust air to the passages 735 and 736 to move the housing up and down in the latter case, or to move member 764 from pickup to insertion position as shown in FIG. 31.

The operation of the device is controlled preferably by either a tape reader or a computer. Upon command from either the computer or the tape reader, the power train 900 turns threaded shaft 431 to move out of the random access shuttle assembly or block drop shuttle assembly to its predetermined position. When its predetermined position is reached, a relay is tripped to tell the computer, if one is being used, that the shuttle pockets are in proper position. The computer then issues a signal to activate the flippers on the magazine assembly, thus allowing one component in each escapement slot to drop down into the shuttle pocket. Relays are used to sense that a component is in each pocket and a further signal is given by the computer to move the shuttle to the transfer assembly.

If the random access shuttle is being used, it moves directly to position whereupon a signal is given to the computer informing the computer that the shuttle is in position and the computer issues a further signal allowing the latches to move aside by the solenoid plunger to drop the components into the transfer assembly.

The same method of operation, as far as signals are concerned, is used in the block drop system except that the block drop shuttle assembly is stepped each time a component is dropped into the transfer assembly.

When the component is in the shuttle assembly, a signal is given to the computer telling it that a component has been received whereupon the computer issues a signal for the transfer mechanism to begin its rotation. The wipers are used to maintain the component as the transfer section rotates. During the first 20° of rotation, the action of the rollers and wipers biases the leads outwardly beyond the position desired for proper insertion. During the latter part of the rotation, the pusher section forces on the last two leads of the component and pushes it over onto the vacuum pocket, leaving a part of the component on top of the vacuum. Therefore, the last two leads of the component always wind up in exactly the same position. This is important since the number of leads on the components will vary, usually between 14 and 16. A signal is then given to the computer, telling it that the component is in proper position on top of the vacuum pocket whereupon the computer issues a signal to the insertion head to rotate 45° and drop onto the part. The swing arm through the pistons in the top of the insertion head and pneumatic chambers swings the finger pickup over the top of the component, drops onto the component, thereby engaging within the recessed areas of the finger pickup the bent portions of the leads, rises up, and then swings back until it is in line with the insertion head again. At that point, a signal is given to the computer telling it that the component is in insertion position and the computer issues a signal to insert. At that point, the jaws are forced downwardly, with the remaining lower portion of the insertion assembly until they engage the printed circuit board and the areas between the teeth thereof are aligned with pre-drilled holes in the circuit board. The finger pickup then moves the component down to the board and the piston shaft is activated pneumatically to push on the top side of the component to force the leads, which have been bent into proper position by the guidance of the jaws, into the circuit board. A clinching mechanism, not shown, may be used to clinch the leads over against the base of the board.

This operation is repeated until all the components loaded in the magazine assembly have been inserted. At that time, the machine is stopped, the magazine and ready pack assembly swung upwardly and new stick carriers are loaded into the magazine and additional components loaded into the ready pack. At that point, the sequence is ready to begin again.

While only one tranfer mechanism and insertion head assembly have been shown and two embodiments of the magazine and shuttle assembly have been shown and described, it will be obvious to those of ordinary skill in the art that many changes can be made to the apparatus without departing from the scope of the appended claims.

What is claimed is:

1. An apparatus for inserting electronic components, said components having a body and dual in-line parallel leads extending therefrom, said apparatus comprising a magazine assembly adapted to receive vertical rows of components, means to release components one at a time from said vertical rows, component transfer means located on said apparatus having biasing means adapted to bias the leads of said components out beyond the desired insertion position, shuttle means adapted to receive individual components from said vertical rows and to deposit them into said component transfer means, movable component insertion means adjacent said component transfer means, said insertion means having a component pickup means adapted to transfer said components from said component transfer means to said insertion means and also having guide means adapted to force the biased leads to insertion position during the insertion stroke of said insertion means.

2. An apparatus as in claim 1 wherein said shuttle means has a single pocket means adapted to receive said components from said vertical rows, said single pocket means adapted to move laterally from said apparatus to said component transfer means and having means adapted to, upon command, drop said components into said transfer means.

3. An apparatus as in claim 2 wherein said apparatus includes a pantograph means located directly under said insertion means, said pantograph adapted to support a printed circuit board having pre-drilled holes adapted to receive the leads of said components.

4. An apparatus as in claim 2 including a rotary drive assembly means adapted to move said single pocket means from under said vertical rows of components to a predetermined position over said component transfer means.

5. An apparatus as in claim 2 wherein said magazine assembly comprises a magazine plate having slot means which constitutes individual escapements for said components, each escapement having a solenoid actuated flipper mechanism for releasing individual components upon command.

6. An apparatus as in claim 2 wherein said shuttle means comprises a carriage, a horizontally extending screw threaded shaft, said carriage having a threaded bore therein and adapted to be moved by rotation of said screw threaded shaft, means for rotating said screw threaded shaft, said carriage supporting a shuttle mechanism having one component receiving pocket means therein.

7. An apparatus as in claim 6 wherein said shuttle mechanism includes latch means, said latch means adapted to be activated to drop individual components into said transfer assembly.

8. An apparatus as in claim 7 including an activation means mounted to said apparatus, said activation means adapted to engage said latches to release components when said shuttle mechanism is in a predetermined position over said component transfer assembly, spring means normally biasing said latch means into a component restraining position.

9. An apparatus as in claim 2 wherein said component transfer means includes means to bias the leads of said components outwardly beyond a predetermined insertion position, said component transfer means including a rotary mechanism adapted to swing 45°.

10. An apparatus as in claim 9 wherein said biasing means comprise a pair of opposed wipers and a pair of opposed rollers, said wipers and rollers acting to bias said leads outwardly during rotation of said rotary mechanism.

11. An apparatus as in claim 9 wherein said component transfer means also includes a vacuum pocket assembly adapted to receive said components at the end of said 45° rotation of said rotary mechanism, said vacuum pocket means adapted to hold said components in place for engagement by said component pickup means on said insertion means.

12. An apparatus as in claim 2 wherein said component pickup means includes a pair of fingers adapted to come down over the bent lead portion of said components and securely engage said component therebetween for transfer to said insertion mechanism.

13. An apparatus as in claim 12 wherein said insertion means includes a swing arm adapted to rotate 45° and to move downwardly to force engagement of said component by said fingers of said pickup means and adapted to swing back into insertion position with said component.

14. An apparatus as in claim 13 wherein said guide means is located on either external side of said fingers of said component pickup means, said guide means adapted to swing away from said fingers when said swing arm rotates said fingers to pick up said component, said guide means having a plurality of opposed teeth thereon which are adapted to guide the extremities of said biased component leads inwardly and downwardly into proper alignment with pre-drilled holes on a printed circuit board.

15. An apparatus as in claim 1 wherein said shuttle means comprises a shuttle mechanism having a plurality of pockets thereon adapted to simultaneously receive one component from a corresponding plurality of vertical rows of components, said shuttle mechanism including means to drop said components, one at a time, onto said transfer means.

16. An apparatus as in claim 15 wherein said apparatus includes a pantograph assembly, said pantograph adapted to support a printed circuit board thereon and move it on an X and Y axis to locate said circuit board underneath said insertion means at a predetermined position to receive a component.

17. An apparatus as in claim 15 wherein said apparatus also includes a drive assembly which is adapted to move said shuttle mechanism laterally on said apparatus, one step at a time, said shuttle mechanism adapted to trap one component into said component transfer means at each lateral movement step.

18. An apparatus as in claim 17 wherein said magazine assembly comprises a magazine plate having a plurality of individual vertical slot means thereon, said individual slot means comprising a plurality of vertical escapements for said components, each escapement having a solenoid actuated flipper mechanism thereon which is adapted, upon command, to drop one component from each of said escapement means into a corresponding pocket on said shuttle mechanism.

19. An apparatus as in claim 17 wherein each shuttle pocket has associated therewith a latch mechanism, means on said apparatus to activate said latches as said corresponding pockets are aligned with said component transfer assembly, said latch means normally being biased into a restraining position thereby preventing release of said components from said pocket means.

20. An apparatus as in claim 15 wherein said transfer assembly includes means to bias said component leads outwardly beyond a predetermined insertion position, said assembly also including a rotary mechanism adapted to swing 45°.

21. An apparatus as in claim 20 wherein said biasing means comprises a pair of opposed wiper blades and a pair of opposed rollers, said wipers and rollers acting to bias said leads outwardly as said rotary mechanism swings through 45°.

22. An apparatus as in claim 20 wherein said transfer means further includes a vacuum pocket assembly, said rotary mechanism adapted to transfer said components to said vacuum pocket assembly as it swings through a 45° rotation, said vacuum pocket assembly adapted to maintain said component in position for engagement by said component pickup means on said movable insertion means.

23. An apparatus as in claim 20 wherein said component pickup means on said insertion means includes a pair of fingers adapted to come down over the bent portions of said component leads and engage said component for transfer to said insertion means.

24. An apparatus as in claim 23 and including a swing arm within said insertion means adapted to rotate 45° and to force said fingers of said component pickup means over said component leads and to move said engaged component back into insertion position.

25. An apparatus as in claim 24 wherein said guide means comprise a pair of jaws mounted on either external side of said fingers, said jaw means having a plurality of opposed teeth which are adapted to force said component leads into insertion position as said component is forced down towards said printed circuit board by said insertion means, said guide means also including latching means to swing said jaws away from said fingers when said fingers are rotated by said swing arm to pick up said component from said component transfer assembly.

26. An apparatus as in claim 25 including a pneumatically operated pusher mechanism, said pusher mechanism adapted to force said component out of said fingers and into engagement with said jaws whereby said component leads are forced inwardly as said component is thrust down toward said circuit board, said leads, after being biased inwardly by said jaws, being in proper alignment with pre-drilled holes in said printed circuit board.

27. An apparatus as in claim 1 including a computer means adapted to automatically sequence the operations of said shuttle means, said component tranfer means, and said insertion means, said computer acting to receive signals when said components are in predetermined position and to give commands for operation of said shuttle means on said apparatus.

* * * * *